United States Patent
Ström et al.

(10) Patent No.: US 9,143,160 B2
(45) Date of Patent: Sep. 22, 2015

(54) CO-COMPRESSION AND CO-DECOMPRESSION OF DATA VALUES

(75) Inventors: Jacob Ström, Stockholm (SE); Per Wennersten, Årsta (SE)

(73) Assignee: TELEFONAKTIEBOLAGET L M ERICSSON (PUBL), Stockholm (SE)

(*) Notice: Subject to any disclaimer, the term of this patent is extended or adjusted under 35 U.S.C. 154(b) by 319 days.

(21) Appl. No.: 13/817,000

(22) PCT Filed: Sep. 3, 2010

(86) PCT No.: PCT/SE2010/050939
§ 371 (c)(1), (2), (4) Date: Feb. 14, 2013

(87) PCT Pub. No.: WO2012/030262
PCT Pub. Date: Mar. 8, 2012

(65) Prior Publication Data
US 2013/0142266 A1    Jun. 6, 2013

(51) Int. Cl.
  *H03M 7/30* (2006.01)
  *G06T 9/00* (2006.01)
  *G10L 19/00* (2013.01)
  (Continued)

(52) U.S. Cl.
  CPC ............... *H03M 7/30* (2013.01); *G06T 9/008* (2013.01); *G10L 19/00* (2013.01); *H03M 7/3082* (2013.01); *H04N 19/126* (2014.11); *H04N 19/51* (2014.11)

(58) Field of Classification Search
  CPC ... H03M 7/30; H04N 19/00587; G10L 19/00; G06T 9/008
  USPC ...................... 375/240.16; 704/201
  See application file for complete search history.

(56) References Cited

U.S. PATENT DOCUMENTS

| | | |
|---|---|---|
| 5,396,376 A | 3/1995 | Chambors et al. |
| 5,956,431 A | 9/1999 | Iourcha et al. |

(Continued)

FOREIGN PATENT DOCUMENTS

| | | |
|---|---|---|
| EP | 11 588 12 | 11/2001 |
| EP | 13 493 98 | 10/2003 |
| WO | WO 02/071736 | 9/2002 |

OTHER PUBLICATIONS

Ström et al, *iPACKMAN: High-Quality, Low-Complexity Texture Compression for Mobile Phones*, Graphics Hardware (2005), 9 pages.

(Continued)

*Primary Examiner* — Dave Czekaj
*Assistant Examiner* — Tsion B Owens
(74) *Attorney, Agent, or Firm* — Nixon & Vanderhye, P.C.

(57) ABSTRACT

A first and a second data value are co-compressed by generating a sequence of symbols having a most significant symbol that is the most significant symbol of a compressed representation of the first data value and a least significant symbol that is the most significant symbol of a compressed representation of the second data value. The compressed representation of the first data value corresponds to at least a portion of the symbols of the sequence of symbols starting from the most significant symbol and extending towards the least significant symbol in a first reading direction. The compressed representation of the second data value also corresponds to at least a portion of the symbols of the sequence of symbols, however, starting from the least significant symbol and extending in an opposite reading direction towards the most significant symbol.

28 Claims, 8 Drawing Sheets

(51) Int. Cl.
*H04N 19/51* (2014.01)
*H04N 19/126* (2014.01)

(56) References Cited

U.S. PATENT DOCUMENTS 6,222,467 B1 * 4/2001 Moon .......................... 341/82
2001/0053184 A1 12/2001 Chujoh et al.
2003/0044074 A1 3/2003 Weiss et al.
2005/0041741 A1 2/2005 Chujoh et al.

OTHER PUBLICATIONS

International Search Report for PCT/SE2010/050939, mailed May 30, 2011.

* cited by examiner

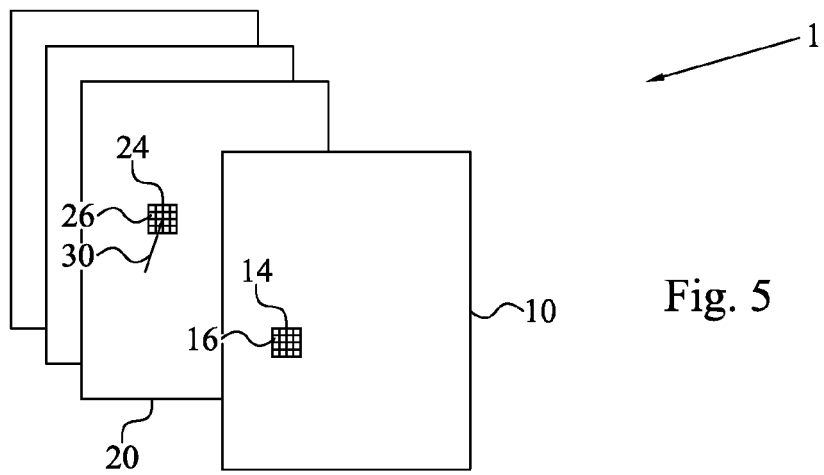
Fig. 5
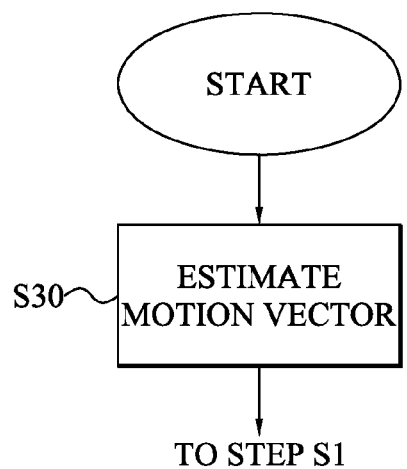
Fig. 6
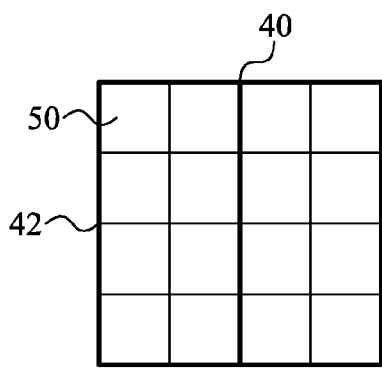
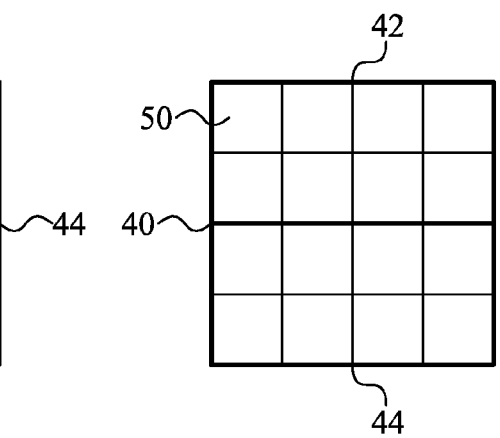
Fig. 7A      Fig. 7B

CO-COMPRESSION AND CO-DECOMPRESSION OF DATA VALUES

This application is the U.S. national phase of International Application No. PCT/SE2010/050939, filed 3 Sep. 2010, which designated the U.S., the entire contents of which is hereby incorporated by reference.

TECHNICAL FIELD

The embodiments generally relate to data compression and decompression, and in particular to a co-compression and decompression of data values.

BACKGROUND

In general, whenever a data value used during compression or coding is quantized, there is a need to distribute the now fewer possible values within the larger set of unquantized values. For instance, when trying to represent a value between 0 and 255 using only four bits, a mapping from the $2^4=16$ possible values to the interval 0 to 255 must be constructed. A common approach within compression and in particular graphics is to store the most significant bits and then replicating them into the positions of the least significant bits during decompression or decoding. Thus, a data value of 240 could be represented by $1110_{bin}$ using four bits, which after bit replication becomes $11101110_{bin}=238_{dec}$. This leads to a representation where possible values are fairly evenly spaced in the interval and include both endpoints since replicating $0000_{bin}$ yields $00000000_{bin}=0_{dec}$ and $1111_{bin}$ becomes $11111111_{bin}=255_{dec}$. FIG. 1A schematically illustrate this concept of even distribution of two data values that each can be represented by two bits.

Another possible approach would be to store the most significant bits but set the least significant bits to an average value, such as $1000_{bin}$ or $0111_{bin}$ for four bits. With this approach, the possible values are again evenly spaced in the interval but the endpoints are not included. This can lead to a slight improvement in the peak signal to noise ratio (PSNR) in some codecs but has the disadvantage of not being able to represent the endpoints of the interval exactly.

A shortcoming with these prior art techniques is that, when two data values are to be co-compressed and the number of bits to spend for each data value is fixed, it is not possible to adjust the accuracy of the two data values. For instance, the two data values could represent two color codewords of a texel block. For some texel blocks the first color codeword is most important, whereas for the other texel blocks the second color codeword is the most important one. However, since the number of bits to spend for the color codewords need to be fixed for all texel blocks it is not possible with the prior art techniques discussed above to improve the accuracy of one of the color codewords at the cost of the accuracy of the other color codeword.

A solution to this problem to sacrifice some accuracy in one of the data values for an increased accuracy in the other data value would be to lattice vector quantize the two data values. A lattice quantizer is generally constructed using the function:

$$\begin{pmatrix} x \\ y \end{pmatrix} = \begin{pmatrix} a & b \\ c & d \end{pmatrix} \begin{pmatrix} i \\ j \end{pmatrix}$$

where i and j are integers and (x,y) is the reconstruction point.

However, a problem when using a lattice quantizer is that decompression is rather complex since a matrix multiplication must be performed. Another drawback with lattice quantization is that not all values of i and j can be used since some values will lead to reconstruction points that fall outside of the allowable value interval. Hence, there will be a problem to find a simple mapping from the index of the reconstruction point to i and j and further an expensive matrix multiplication from (i,j) to get to (x,y). This problem is known as the truncation problem in the art.

There is therefore a need for a solution that allows efficient compression or quantization of data values that does not have the drawbacks of lattice vector quantization.

SUMMARY

It is a general objective to provide an efficient data compression and decompression of data values.

It is a particular objective to provide such a data compression and decompression allowing adjustment of the respective accuracy in representing the data values.

These and other objectives are met by embodiments as disclosed herein.

Briefly, a data compressing method involves co-compressing at least a first data value and a second data value by generating a sequence of symbols, also denoted symbol sequence. The symbol sequence has a most significant symbol that is the most significant symbol in a compressed representation of the first data value and a least significant symbol that is the most significant symbol in a compressed representation of the second data value. The compressed representation of the first data value comprises at least a portion of the symbols in the symbol sequence starting from the most significant symbol and extending in a first reading direction towards the least significant symbol. The compressed representation of the second data value also comprises at least a portion of the symbols sequence, however, starting from the least significant symbol of the symbol sequence and extending in a second, opposite reading direction towards the most significant symbol of the symbol sequence. The generated symbol sequence is then stored as a compressed representation of at least the first and the second data values.

Hence, one and the same symbol sequence represents compressed representations of the first and the second data value. By having a single symbol sequence that are read in different reading directions to obtain the first and second data values at least some of the symbols of the symbol sequence and possible all of the symbols will be shared between the two compressed representations. As a consequence, the accuracy when representing one of the data values with its compressed representation can be increased at the cost of the accuracy of the other data value. This means that a dynamic adjustment of the accuracy can be obtained each time a pair of data values is co-compressed.

A corresponding data decompression method involves providing the symbol sequence and extracting the compressed representation of the first data value from the sequence of symbols. This compressed representation is obtained by reading the symbol sequence in the first reading direction starting from the most significant symbol of the symbol sequence and extending towards the least significant symbol. The extracted compressed representation is then stored as a decompressed representation of the first data value. The compressed representation of the second data value is also obtained by reading the symbol sequence but in the second, opposite reading direction starting from the least significant symbol of the symbol sequence and extending towards the most significant symbol. The extracted and read symbols are then stored as a decompressed representation of the second data value.

A data compressing device according to an aspect comprises a compressor configured to co-compress the data values by generating the symbol sequence having a most significant symbol that is also the most significant symbol of the compressed representation of the first data value and a least significant symbol that is the most significant symbol of the compressed representation of the second data value. The data compressing device also comprises a memory configured to store the generated symbol sequence as compressed representation of at least the two data values.

A corresponding data decompression device comprises a sequence provider configured to provide the symbol sequence as generated by the data compressing device. A representation extractor is configured to extract the compressed representation of the first data value from the symbol sequence by reading the symbol sequence in the first reading direction starting from the most significant symbol and extending towards the least significant symbol. The representation extractor also extracts the compressed representation of the second data value from the symbol sequence by reading the symbol sequence in the second, opposite reading direction starting from the least significant symbol and extending towards the most significant symbol of the symbol sequence. The two extracted sets of symbols are then stored in a memory as decompressed representations of the first and second data values.

The data compression and decompression methods and devices can be used in connection with various technical implementations, for instance, in stereo audio coding and decoding, motion vector coding and decoding during video coding and decoding and texture coding and decoding.

BRIEF DESCRIPTION OF THE DRAWINGS

The invention, together with further objects and advantages thereof, may best be understood by making reference to the following description taken together with the accompanying drawings, in which:

FIG. 5 is a schematic illustration showing the concept of motion vector estimation;

FIG. 6 is a flow diagram illustrating an embodiment of a method of compressing a motion vector;

FIGS. 7A and 7B illustrate different embodiments of a texel block;

DETAILED DESCRIPTION

Throughout the drawings, the same reference numbers are used for similar or corresponding elements.

The present embodiments generally relate to data compression or coding and data decompression or decoding. In particular, the embodiments provide a novel technique that allows efficient co-compression of multiple, i.e. at least two, data values, which enables adjusting the accuracy of the data values. Thus, the embodiments allow increasing the accuracy in representing one data value at the cost of the other data value(s) without having to adjust the number of symbols or bits spent for representing the data values.

Data value as used herein represents any parameter value, codeword value or other information that needs to be compressed. Thus, the data value could represent any property or parameter that needs to be provided in a compressed or encoded form to thereby reduce the number of symbols, such as bits, required for representing the property or parameter.

Compression

Figure 2:
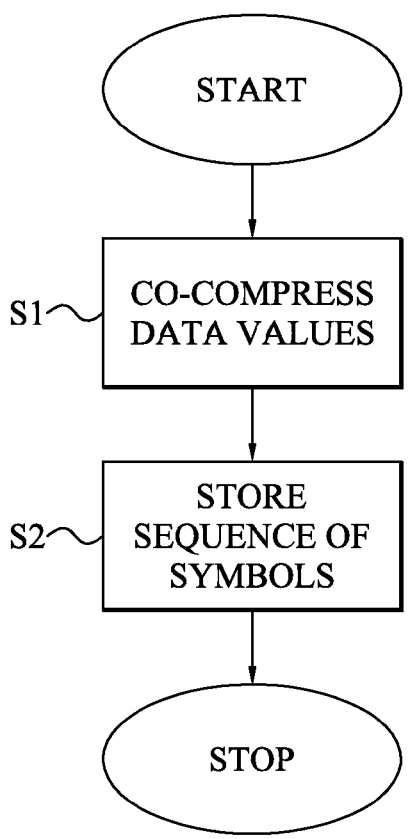
FIG. 2 is a flow diagram illustrating an embodiment of a data compressing method.

FIG. 2 is a flow diagram illustrating a data compressing method according to an embodiment. The method starts in step S1. This step S1 involves co-compressing at least a first data value and a second data value by generating a sequence of symbols. This sequence of symbols can be according to any of the traditionally employed symbol alphabets within data compression and coding. For instance, the alphabet of symbols could be a binary alphabet. In such a case the symbols can be $0_{bin}$ or $1_{bin}$. Other alphabets of symbols that can be used include hexadecimal symbols, i.e. $0-9_{hex}$ and $A-F_{hex}$, decimal symbols, i.e. $0-9_{dec}$. In the examples presented further herein a binary alphabet with a sequence of bits is used as an illustrative embodiment of symbol alphabet.

The sequence of symbols generated in step S1 has a most significant symbol, a least significant symbol and intermediate symbols, i.e. $s_0, s_1, \ldots, s_k$ for a sequence of k symbols. The most significant symbol of the sequence, i.e. $s_0$, is also the most significant symbol of a compressed representation of the first data value. The least significant symbol of the sequence, i.e. $s_k$, is the most significant symbol of a compressed representation of the second data value. Furthermore, the compressed representation of the first data value comprises at least a portion of the sequence of symbols starting from the most significant symbol $s_0$ and extending in a first reading direction towards the least significant symbol $s_k$. Correspondingly, the compressed representation of the second data value comprises at least a portion of the sequence of symbols but starting from the least significant symbol $s_k$ and extending in a second, opposite reading direction towards the most significant symbol $s_0$ of the sequence of symbols.

Thus, one and the same sequence of symbols is generated to be a compressed representation of the first data value and the second data value. However, the compressed representations of the data values are read according to different reading directions of the sequence of symbols and starts at different ends of the sequence of symbols.

For instance, assume that the sequence of symbols is in the form of $s_0, s_1, s_2, s_3, s_4, s_5, s_6, s_7$ for a sequence of eight symbols. Further assume that the compressed representations of the first and second data values are both of eight symbols each. In such a case, the compressed representation of the first data value starts with the most significant symbol $s_0$ and proceeds in the first reading direction up to and including the least significant symbol $s_7$ to get the compressed representation in the form of $s_0s_1s_2s_3s_4s_5s_6s_7$. The compressed representation of the second data value instead starts with the least significant symbol $s_7$ and proceeds in the opposite reading direction up to and including the most significant bit $s_0$ to get the compressed representation in the form of $s_7s_6s_5s_4s_3s_2s_1s_0$.

The length of the compressed representations in terms of the number of symbols must not necessarily be equal to the length of generated sequence of symbols as has been exemplified above. In clear contrast and as has previously been mentioned the compressed representations corresponds to at least a portion of the sequence of symbols. Thus, the compressed representation can correspond to all symbols of the sequence of symbols or merely a subset or portion thereof. It is further not necessary that each and every symbol is read in respective reading direction. In clear contrast, for instance, every second symbol can be used in of the reading directions for at least a portion of the sequence of symbols, which is further discussed herein.

If the compressed representation corresponds to a portion of the sequence of symbols, the compressed representation of the first data value starts with the most significant symbol $s_0$ and proceeds in the first reading direction towards but not necessarily including the least significant bit $s_7$. For instance, if the compressed representations are both of six symbols, whereas the sequence of symbols is of eight symbols as presented above the compressed representation of the first data value could be $s_0s_1s_2s_3s_4s_5$ and the compressed representation of the second data value could become $s_7s_6s_5s_4s_3s_2$.

Though, the compressed representations of the two data values typically have the same size in terms of the number of symbols, the embodiments are not limited thereto. Thus, in an alternative embodiment the two compressed representations may have different symbol lengths. For instance, the compressed representation of the first data value could, according to the example above, consist of eight symbols $s_0s_1s_2s_3s_4s_5s_6s_7$, whereas the compressed representation of the second value could, for instance, contain only six symbols $s_7s_6s_5s_4s_3s_2$.

The point of reversing the reading order for the two data values is that the most significant symbol of the symbols in the sequence of symbols that are shared between the two data values (all symbols in the first example above and symbols $s_2$ to $s_5$ in the second example above) in one of the compressed representations should preferably be the least significant symbol in the other compressed representation. As a consequence, we maximize the chance that the quality in representing the two data values with the two compressed representations can be improved by changing one of the compressed representations slightly to the benefit of the other. Thus, the compressed representations shares at least one, typically multiple of the symbols in the generated sequence of symbols.

This technique of co-compressing two data values gives obvious benefits whenever one of the two data values will never be used during decompression. However, the co-compressing also leads to improvements whenever one of the compressed representations is more important than the other, such as when used more often.

For instance, a texel (texture element) or pixel block of a texture or image could be encoded by generating two color codewords that are compressed representations of two color values. In the prior art, a first set of symbols have been assigned to the first color codeword and another set of symbols have been assigned to the second color codeword. These two sets of symbols further have fixed sizes in order to facilitate random access of the encoded texel or pixel block during decoding. For some texture or pixel blocks about half the texels or pixels will use the first color codeword, whereas the remaining texels or pixels with use the second color codeword. In such a case, spending the same amount of symbols for both color codewords is typically acceptable. However, for other texel or pixel blocks in the texture or image, it could be possible that all or almost all texels or pixels will use only the first color codeword. This means that such a texel or pixel block will be very sensitive to errors in the first color codeword but rather insensitive to errors in the second color codeword. Hence, the symbols spent for the second color codeword are then fully or almost fully in vain and the quality, such as PSNR, of the texel and pixel block would have been increased by instead spending more symbols on the first color codeword at the cost of the number of symbols for the second color codeword. However, in order to allow random access and easy decoding of the texel and pixel blocks all compressed representations of the texel and pixel block in the texture or image should have the same distribution of symbols among the different codeword. Thus, in the art it is generally not acceptable to spend different number of symbols for two color codewords for a first texel or pixel block as compared to another texel or pixel block. Additionally, if different number of symbols are spent on the two color codewords for different texel or pixel blocks but the sum of the symbols spent for the two color codewords are equal for all texel or pixel blocks other problems occurs. For instance, the decoder becomes more complex since extra logic is required in the decoder to determine how many symbols that are spent on each color codeword and which particular symbols belong to which color codeword. There is therefore generally not acceptable to spend, for instance, four symbols per color codeword for a first texel or pixel block and then spend, for instance, eight or seven symbols for the first color codeword and zero or one symbol on the second color codeword for a second texel or pixel block in the texture or image. It is therefore not possible according to the prior art to dynamically adjust the accuracy between the color codewords between texel or pixel blocks.

According to the embodiments, the most important data value in terms of contributing the most to the error in representing the two data values with the sequence of symbols will affect the selection of the common symbols in the sequence of symbols to a larger extent than the other data value. For instance, if one of the data values will not be used at all, the symbols in the sequence of symbols can be selected solely based on the other data value.

The result of this shared compression or co-compressing, outputting a sequence of symbols that are read forwards to get the compressed representation of a first data value and backwards to get the compressed representation of a second data value, improves the quality by reducing the error between the original data values and decompressed representations of the data values. This quality improvement is in particular evident when one of the data values is more important and used more often than the other data value.

Figure 1A:
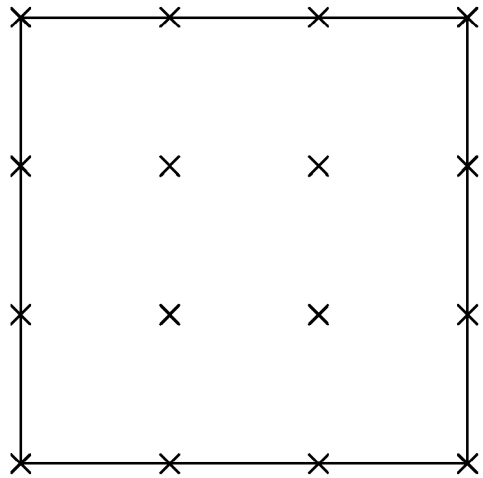
FIGS. 1A and 1B illustrate compression or quantization of two data variables according to the prior art and according to an embodiment, respectively.
Figure 1B:
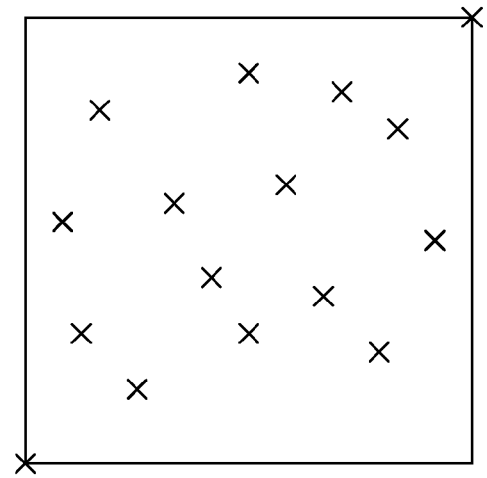

FIG. 1A illustrates compression or quantization of two data variables according to the prior art with an even distribution of data values. In the figure, the x-axis represents possible compressed representations of the first data value and the y-axis represents possible compressed representations of the second data value. FIG. 1B in clear contrast illustrates the non-even distribution of compressed representations that can be obtained according to the embodiments. Thus, the accuracy of one of the compressed representations can be sacrificed to some desired extent to the benefit of the other compressed representation.

The sequence of symbols generated in step S1 is stored in step S2 as a compressed representation of at least the first data value and the second data value. The sequence of symbols is typically stored in a memory, such as RAM, ROM or cache, from where it can be fetched to decompress the compressed representation to get decompressed representations of the first and/or second data values.

The sequence of symbols generated in step S1 achieves a compression by having a size in terms of the number of symbols that is smaller than the combined size, in terms of the number of symbols, of the data values to be compressed. For instance and with reference to the previous examples, the first and second data values could each consist of eight symbols and then the generated sequence of symbols consists of eight symbols, thereby achieving a compression ratio of 1:2.

The embodiments can also be applied to the case where more than two data values are co-compressed to generate the sequence of symbols. Different such examples are presented below and exemplified with the case of three data values. The examples can be extended further to also encompass co-compressing four or even more data values, if necessary.

In the case of co-compressing three data values, the most significant symbol of the generated sequence of symbols is also the most significant symbol of the compressed representation of the first data value and the least significant symbol of the sequence of symbols is the most significant symbol of the compressed representation of the second data value. The most significant symbol of a compressed representation of a third data value, however, is one of the intermediate symbols of the sequence of symbols, i.e. a symbol different from the most significant symbol and the least significant symbol of the sequence of symbols.

Furthermore, the compressed representation of the first data value consists of at least a portion of the symbols in the sequence of the symbols starting from the most significant symbol and extending in the first reading direction towards and possibly including the least significant symbol.

The compressed representation of the second data value consists of at least a portion of the symbols in the sequence of symbols and starting from the least significant symbol and extending in the second, opposite reading direction for at least a portion of the sequence of symbols towards the most significant symbol. In this case, all symbols of the compressed representation of the second data value could be obtained by reading in the second, opposite reading direction. In an alternative approach a first set of multiple symbols of the compressed representation of the second data value is obtained by reading the sequence of symbols in the second, opposite reading direction starting from the least significant symbol. A second, remaining set of symbols of the compressed representation of the second data value could then be obtained by reading a remaining portion of the sequence of symbols in the first reading direction, the second, opposite reading direction or by reading a first remaining portion of the sequence of symbols in the first reading direction and a second remaining portion of the sequence of symbols in the second, opposite reading direction.

The compressed representation of the third data value consists of at least a portion of the symbols in the sequence of symbols starting from the defined intermediate symbol and extending in the first reading direction or in the second, opposite reading direction for at least a portion of the sequence of symbols towards the least significant symbol or towards the most significant symbol. In this case, all symbols of the compressed representation of the third data value could be obtained by reading in the first reading direction or in the second, opposite reading direction. In an alternative approach a first set of multiple symbols of the compressed representation of the third data value is obtained by reading the sequence of symbols in the first reading direction or in the second, opposite reading direction starting from the defined intermediate symbol. A second, remaining set of symbols of the compressed representation of the third data value could then be obtained by reading a remaining portion of the sequence of symbols in the first reading direction, the second, opposite reading direction or by reading a first remaining portion of the sequence of symbols in the first reading direction and a second remaining portion of the sequence of symbols in the second, opposite reading direction.

For instance, assume that that the generated sequence of symbols is defined as $x_0x_1x_2y_2y_1y_0z_2z_1z_0$. The compressed representation of the first data value (x) could then be defined as $x_0x_1x_2y_2y_1y_0z_2z_1z_0$, i.e. reading the complete sequence of symbols in the first reading direction starting from the most significant symbol $x_0$. The compressed representation of the second data value (z) could be $z_0z_1z_2x_2x_1x_0y_2y_1y_0$. Then a first portion of the sequence of symbols is read in the second, opposite reading direction starting from the least significant symbol $z_0$ to get the three most significant symbols of the compressed representation $z_0z_1z_2$. The following three symbols $x_2x_1x_0$ are obtained by reading a second portion of the sequence of symbols in the second, opposite reading direction and the three least significant symbols $y_2y_1y_0$ are obtained by reading a third and remaining portion of the sequence of symbols in the first reading direction. Thus, the compressed representation of the second data value can be obtained by using both reading directions and also by reading different portions of the sequence of symbols. The important feature is though that the first set of symbols of the compressed representation is obtained by reading symbols in the second, opposite reading direction starting from the least significant symbol of the sequence of symbols.

The compressed representation of the third data value (y) could correspond to $y_0y_1y_2z_2z_1z_0x_2x_1x_0$. This compressed representation is therefore obtained by starting from an intermediate symbol ($y_0$) and reading the sequence of symbols in the second, opposite reading direction for a first portion to get the three most significant symbols $y_0y_1y_2$. The following three symbols $z_2z_1z_0$ are obtained by reading a second portion of the sequence of symbols in the first reading direction and the final three symbols $x_2x_1x_0$ comes from reading a third, remaining portion of the sequence of symbols in the second, opposite reading direction.

The above presented example is particularly suitable if one of the data values will not be used. In such a case, the accuracy in one of the other two data values can be increased by three symbols.

In an alternative embodiment, the generated sequence of symbols is defined as $x_0x_1x_2y_2z_2y_1z_1y_0z_0$. The first data value is then obtained as in the example above by reading the complete sequence of symbols in the first reading direction starting from the most significant bit ($x_0$) to get $x_0x_1x_2y_2z_2y_1z_1y_0z_0$. The compressed representation of the second data value is obtained by reading the sequence of symbols in the second, opposite reading direction starting from the least significant bit ($z_0$) and reading every second symbol to get $z_0z_1z_2x_2$. This corresponds to the four most significant symbols of the compressed representation. The four least significant symbols are obtained by reading the remaining symbols of the sequence of symbols to get $y_2x_1y_1x_0y_0$. The final compressed representation is therefore $z_0z_1z_2x_2y_2x_1y_1x_0y_0$. The main difference as compared to above is that the first set of symbols of the compressed representation is obtained by reading every second symbol in the second, opposite reading direction starting from the least significant symbol instead of reading every symbol.

The compressed representation of the third data value is also obtained by reading the sequence of symbols in the second, opposite reading direction starting from a defined intermediate symbol ($y_0$) and continuing by reading every second symbol to get $y_0y_1y_2$. The five least significant symbols are then obtained by reading the remaining symbols to get $z_2x_2z_1x_1z_0x_0$ and the complete compressed representation of $y_0y_1y_2z_2x_2z_1x_1z_0x_0$.

This embodiment is in particular suitable if any of the data values are more important than the other two but these other two data values will still be used during decoding and cannot have zero accuracy. In such a case, the most important data value, such as x, can increase its accuracy by affecting and defining the symbols $y_2$ and $z_2$.

In a further variant the same sequence of symbols as in above, i.e. $x_0x_1x_2y_2z_2y_1z_1y_0z_0$ is generated, and the compressed representation of the first data value is obtained as also described above to get $x_0x_1x_2y_2z_2y_1z_1y_0z_0$. The three most significant symbols of the compressed representation of the second data value is obtained as disclosed above by reading a portion of the sequence of symbols in the second, opposite reading direction starting from the least significant symbol and reading every second symbol to get $z_0z_1z_2$. The following three symbols are obtained in the same way as the three most significant symbols but instead starting from the symbol $y_0$ to get $y_0y_1y_2$. The third and remaining symbols are obtained by instead reading every symbol in the first part of the sequence of symbols in the second, opposite reading direction to get $x_2x_1x_0$ and the complete compressed representation of $z_0z_1z_2y_0y_1y_2x_2x_1x_0$.

The first three symbols of the compressed representation of the third data value are obtained as in the previous example to get $y_0y_1y_2$. The following three symbols are obtained by reading a portion of the sequence of symbols in the first reading direction starting from symbol $z_2$ and reading every second symbol to get $z_2z_1z_0$. The third and remaining portion of the compressed representation is obtained in the same way as for the second data value above to get $x_2x_1x_0$ and the complete compressed representation of $y_0y_1y_2z_2z_1z_0x_2x_1x_0$.

These examples can of course also be modified to not read all symbols of the symbol sequence for at least one or all compressed representations.

Figure 3:
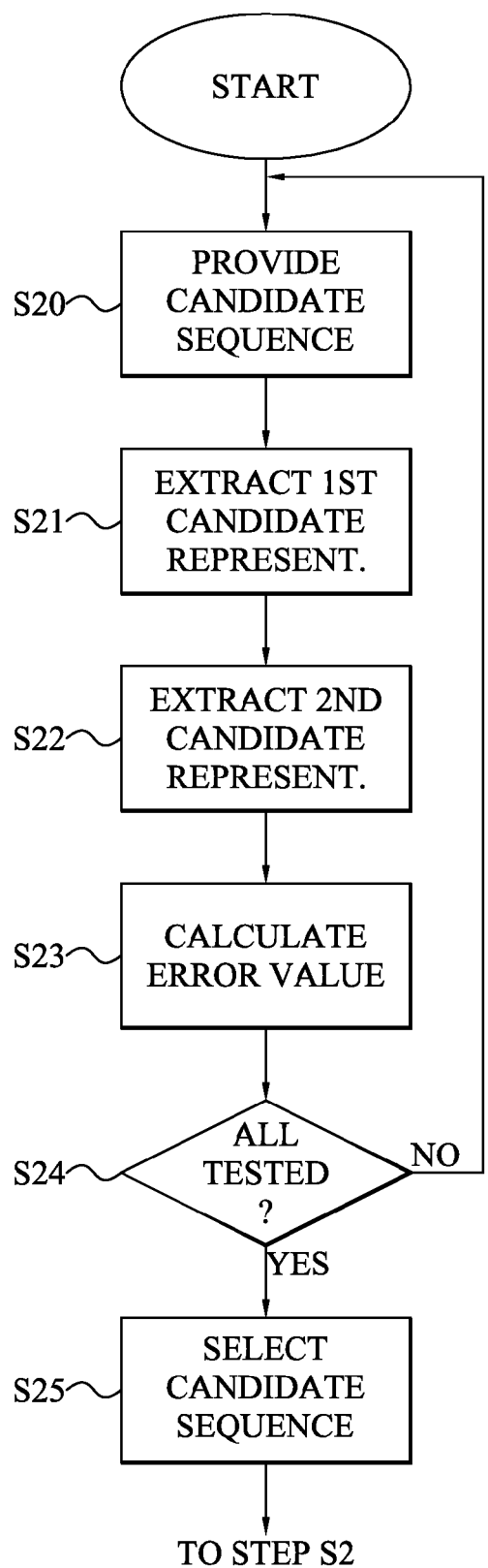
FIG. 3 is a flow diagram illustrating additional method steps of the data compressing method in FIG. 2.

FIG. 3 is a flow diagram illustrating an embodiment of the co-compressing step of FIG. 1. The method starts in step S20 where a candidate sequence of symbols is provided. The candidate sequence has a defined length in terms of number of symbols that is dictated by the particular application, i.e. the number of symbols that can be spent for compressing the two data values. The provision of candidate sequence in step S20 can be conducted according to various embodiments. In a first case, a random sequence of symbols having the defined symbol length is generated in step S20. Alternatively, the candidate sequence could be a defined starting candidate sequence, such as a sequence of (identical) symbols corresponding to the smallest or largest value representable by the sequence of symbols. Actually, any sequence of symbols having the defined symbol length can be provided in step S20.

A next step S21 extracts a candidate compressed representation of the first data value from the candidate sequence of symbols. This candidate compressed representation corresponds to at least a portion of the candidate sequence of symbols provided in step S20. Furthermore, the candidate compressed representation is extracted by reading the candidate sequence of symbols in the first reading direction starting from the most significant symbol of the candidate sequence of symbols and extending towards the least significant symbol of the candidate sequence of symbols.

Step S22 correspondingly extracts the candidate compressed representation of the second data value by reading the candidate sequence of symbols in the second, opposite reading direction starting from the least significant symbol of the candidate sequence of symbols and extending towards the most significant symbol of the candidate sequence of symbols. The read symbols corresponding to at least a portion of the symbols of the candidate sequence of symbols but read in the opposite direction as compared to step S21 will thereby represent the candidate compressed representation of the second data value having its most significant symbol corresponding to the least significant symbol of the candidate sequence of symbols.

A next step S23 calculates an error value indicative of an error in representing the first data value with the candidate compressed representation of the first data value extracted in step S21 and representing the second data value with the candidate compressed representation of the second data value extracted in step S22. The error value is calculated in step S23 based on the candidate compressed representation of the first data value and the candidate compressed representation of the second data value, preferably based on a difference between the first data value and the candidate compressed representation of the first data value and based on a difference between the second data value and the candidate compressed representation of the second data value. Different error values are known and used in the art and can also be used according to the embodiments. For instance, SSD represents the sum of the squared differences $\epsilon=(D_1-CD_1)^2+(D_2-CD_2)^2$, where $\epsilon$ denotes the error value, $D_1/D_2$ represents the first/second data value and $CD_1/CD_2$ represents the candidate compressed representation of the first/second data value. Another error value that can be used is SAD, which is the sum of the absolute differences $\epsilon=|D_1-CD_1|+|D_2-CD_2|$. It is also possible to use a weighted error value, especially if the two data values are going to be used with different frequency. For instance a weighted SSD error value could be used such as $\epsilon=w_1(D_1-CD_1)^2+w_2(D_2-CD_2)^2$, where $w_1$ denotes the weight for the first value and $w_2$ denotes the weight for the second value. The weights can then be defined based on the frequency in using respective data value. For instance, assume that the first data value is used for 12 texels in a texel block and the other data value is merely used by 4 texels. In such a case, $w_1=12$ or $$w_1 = \frac{3}{4}$$

and $w_2=4$ or $$w_2 = \frac{1}{4}.$$

The loop of steps S20 to S23 is then repeated to test multiple different candidate sequence of symbols. In such a case, step S20 can randomly generate another candidate sequence of symbols or another candidate sequence of symbol can be provided by stepping up the next smallest or largest sequence of symbols.

In a particular embodiment all possible candidate sequence of symbols having the same defined length in terms of number of symbols are tested. This implies that $P^k$ candidate sequence of symbols have to be tested, where P represents the number of different symbols in the symbol alphabet and k is the number of symbols in the candidate sequences of symbols. Step S24 schematically illustrates this concept by verifying whether all possible candidate sequence of symbols has been tested. If not then method continues back to step S20 where a new candidate sequence of symbols is tested.

More refined optimization procedures can be used instead of an exhaustive search, in particular for fairly large symbol alphabets. Non-limiting example include Monte Carlo based algorithms or other optimization algorithms known in the art.

In an alternative approach, the two data values are first quantized independently and then different contributions of the data values to the common symbols are tested. For instance, assume that the first data value is $11101110_{bin}$ and the second data value is $10010010_{bin}$, these two data values can first be independently quantized from eight bits down to four bits each to get $1110_{bin}$ and $1001_{bin}$. The first candidate sequence of symbols thereby becomes $11101001_{bin}$ and the candidate compressed representation of the first data value is $11101001_{bin}$ and the candidate compressed representation of the second data value is $10010111_{bin}$. Other candidate sequences of symbols can then be obtained by increasing or decreasing the contribution that the first or second data value makes to the common intermediate bits. Non-limiting example could therefore be $11101001_{bin}$, $11101101_{bin}$, $11101111_{bin}$, $11101110_{bin}$, $11101001_{bin}$, $11001001_{bin}$, $11001001_{bin}$ and $01001001_{bin}$. This significantly limits the number of candidate sequences of symbols that need to be tested and the probability that one of these candidate sequences of symbols is a good candidate in terms of PSNR is very high.

Thus, in this embodiment not all potential candidate sequences of symbols need to be tested in step S24. In clear contrast, the candidate sequence of symbols comprises the set of sequences of symbols for which all symbols are defined based on the first data value up to the sequence where all symbols are defined based on the second data value. Thus, a first candidate sequence of symbols could then be equal to the first data value, a second candidate sequence of symbols have all but the least significant symbol equal to the most significant symbols of the first data value and the least significant symbol equal to the most significant symbol of the second data. A next candidate sequence of symbols have all but the two least significant symbols equal to the most significant symbols of the first data value and the least significant symbol equal to the most significant symbol of the second data value and the second least significant symbol equal to the second most significant symbol of the second data value. This is continued up to the candidate sequence which comprises the symbols of the second data value but in reversed order, i.e. the most significant symbol of the candidate sequence is equal to the least significant symbol of the second data value and the least significant symbol of the candidate sequence is equal to the most significant symbol of the second data value.

If the symbol alphabet comprises more than two different symbols an average of the symbols in the first and second data values can be calculated for the or those intermediate symbols in the candidate sequence of symbols that are shared between the compressed representations of the first and second data values.

The next step S25 then selects one of the tested candidate sequence of symbols to use as sequence of symbols and compressed representation of the first and second data values. This sequence selection in step S25 is performed based on the respective error values calculated for each tested candidate sequence of symbols. In a preferred embodiment, step S25 therefore involves selecting the candidate sequence of symbol that results in the smallest error as determined based on the calculated error values.

The method then continues to step S2 of FIG. 2, where the selected candidate sequence of symbols is stored as compressed representation of the first and second data values.

The method described above and illustrated in FIG. 3 can also be applied to the case of three of more data values by extracting candidate compressed representations for each data value and calculate the error values based on respective differences for each data value.

In an alternative embodiment, the calculation of error values in step S23 can be omitted. This works well in those cases where one on beforehand knows or can guess which candidate sequence of symbols that will get the best result. Also a heuristic algorithm could be used to identify such a candidate sequence of symbols. For instance, assume that two color codewords are to be co-compressed for a texel block and that all texels in the texel block have the same color value. In such case, the candidate sequence of symbols that is equal to this color value or one of its color components will give best result and there is not need to calculate any error value.

This can be extended one step further by investigating the texel distribution in a texel block, i.e. determine how many texels that will use the first color codeword and how many will use the second color codeword. In such a case, Table 1 presented below can be used in order to define the best candidate sequence of symbols. In the table, the symbol distribution in the sequence of symbols is defined for a candidate sequence of eight symbols. In such a case, codeword 1:5 symbols and codeword 2:3 symbols implies that the five most significant symbols of the sequence of symbols are equal to the five most significant symbols of the first color value and the three least significant symbols of the sequence of symbols correspond to the three most significant symbols of the second color value but in reversed order. Texel distribution [11 5] implies that 11 of the texels have the first color value and 5 of the texels have the second color value.

TABLE 1

Symbol distributions for different texel distributions

| Texel distribution | Symbol distribution | |
|---|---|---|
| | Codeword 1 | Codeword 2 |
| [16 0] | 8 symbols | 0 symbols |
| [15 1] | 5 symbols | 3 symbols |
| [14 2] | 5 symbols | 3 symbols |
| [13 3] | 5 symbols | 3 symbols |
| [12 4] | 4 symbols | 4 symbols |

TABLE 1-continued

Symbol distributions for different texel distributions

| Texel distribution | Symbol distribution | |
|---|---|---|
| | Codeword 1 | Codeword 2 |
| [11 5] | 4 symbols | 4 symbols |
| . . . | . . . | . . . |
| [5 11] | 4 symbols | 4 symbols |
| [4 12] | 4 symbols | 4 symbols |
| [3 13] | 3 symbols | 5 symbols |
| [2 14] | 3 symbols | 5 symbols |
| [1 15] | 3 symbols | 5 symbols |
| [0 16] | 0 symbols | 8 symbols |

Step S25 does not need to be conducted based on any error values but rather based on other parameters, such as the frequency of the first and second data values, i.e. how often or many times they are used, for the entity that should be compressed.

In a particular embodiment of the method illustrated in FIG. 2, step S1 involves co-compressing the first and second data values by generating a sequence of bits having a most significant bit (MSB), which also is the MSB of the compressed representation of the first data value and a least significant bit (LSB) that is the MSB of the compressed representation of the second data value. The compressed representation of the first data value comprises at least a portion of the sequence of bits starting from the MSB of the sequence of bits and extending in the first reading direction towards the LSB of the sequence of bits. The compressed representation of the second data value comprises at least a portion of the sequence of bits starting from the LSB of the sequence of bits and extending in the second, opposite reading direction towards the MSB of the sequence of bits. Step S2 then involves storing the sequence of bits as compressed representation of the first and second data values.

Compression Implementations

The compressing method according to the embodiments can be used in vastly different applications, where two or more data values are to be co-compressed. Herein follows a number of implementation examples within the field of media coding represented by audio coding, texture coding and video coding. The present embodiments are, however, not limited to these particular examples or indeed to the technical field of media coding.

In audio coding and particular stereo audio coding at least two different audio channels are employed to get a stereo effect when playing the audio using, typically, a pair of loudspeakers. Each audio channel is then encoded or compressed to get a compressed audio value per sample. Hence, at each sample instance one get a first or right audio value and a second or left audio value. For instance, stereo audio coding can use pulse-code modulation (PCM) to digitally represent a sampled analog audio signal.

In some applications, audio effects are used in order to let the played audio travel from one of the loudspeaker to the other loudspeaker. One loudspeaker thereby becomes almost silent, i.e. low signal-to-noise ratio (SNR), for at least some audio samples, whereas most played audio comes from the other loudspeaker, i.e. having a high SNR. In such a case, it is from quality point of view a waste to spend bits on audio data for the silent loudspeaker as these will not be played or played at such a low sound level that they are not perceived by a listener to the same degree as the sound from the other loudspeaker. Hence, it would be advantageously to, during a stream of stereo audio data, dynamically adjust the importance of the audio values on sample basis so that the accuracy in representing the audio values is dynamically adjusted for the stream.

Figure 4:
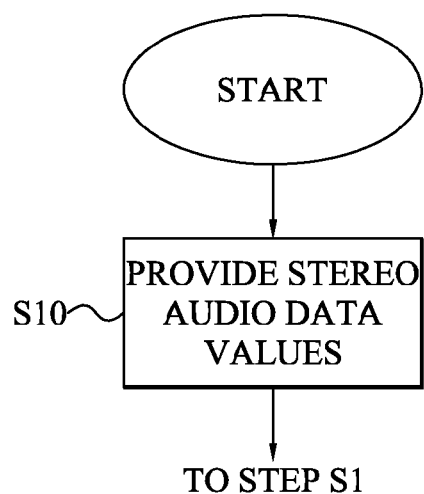
FIG. 4 is a flow diagram illustrating an embodiment of a method of compressing stereo audio data.

FIG. 4 illustrates such an embodiment. The method starts in step S10 where stereo audio values representing respective stereo audio samples of an audio stream are provided. The audio values can, for instance, be obtained from a PCM process to get, for each sample instance, a right audio value having a defined bit length and a left audio value preferably having the same defined bit length.

The method then continues to step S1 of FIG. 2, where the right and left audio values are co-compressed as described above in connection with FIG. 2 to get a compressed representation of the right and left audio values. In such a case, the audio samples for which both the right and left channels will be played at substantially the same sound level the right and left audio values will contribute to substantially the same extent when generating the compressed representation for that audio sample. However, for other audio samples, where one of the channels will be silent or played at a much lower sound level, the audio value of the other channel can contribute to a larger extent when generating the compressed representation for that sample. The perceived audio quality will then be improved.

The right (or left) audio value will then be obtained by reading the compressed representation in the first direction starting from the most significant symbol, typically MSB, whereas the left (or right) audio value is obtained by reading the compressed representation in the opposite direction starting from the least significant symbol, typically LSB.

Another application of the embodiments is within the field of video coding, here represented by inter coding. With reference to FIG. 5, a video sequence 1 comprises multiple, i.e. at least two, frames or pictures 10, 20. Such a frame 10, 20 can in turn be regarded as composed of a series of one or more slices, where such a slice consists of one or more macroblocks 14, 24 of pixels or image elements 16, 26. Such a pixel 16, 26 has associated property value, such as color, in the red, green, blue, RGB, space, or luminance (Y) and chrominance (Cr, Cb or sometimes denoted U, V).

In inter coding a macroblock 14 in a current frame 10 is encoded with reference to a reference macroblock 24 in a reference frame 20. In such a case, a motion vector estimation procedure is conducted in order to estimate and determine a motion vector 30 associated with or pointing towards the reference macroblock 24. This reference macroblock 24 or more correctly the property values of the pixels 26 in the reference macroblock 24 are used in the coding of the property values of the pixels 16 in the current pixel block 14, which is well known in the art and therefore not described further herein.

The motion vector will therefore comprise two coordinate values, one representing the displacement along the x-axis and the other representing the displacement along the y-axis. In some applications, the accuracy at which these two coordinate values are represented need not be equal. For instance, assume a current frame 10 and a reference frame 20 representing a stripes pattern in the form of multiple vertical lines. In such a case, the accuracy of representing the y-coordinate of the motion vector 30 is not that important since any errors in the y-coordinate would merely result in that the reference macroblock 24 is misplaced along the length of one or multiple lines. However, a misplacement of the reference macroblock 24 along the x-axis would easily be seen when playing out the video sequence as a visual artifact in the form of obvious and local displacement of one or more of the lines to the right or left. Hence, in this case it would be advantageous to dynamically adjust the accuracy in representing the coordinate values of the motion vector.

FIG. 6 is a flow diagram illustrating an embodiment of this compressing a motion vector 30 for a pixel block 14, such as a macroblock, comprising multiple pixels 16 in a frame 10 of an image or a video sequence 1. The method starts in step S30 where a motion vector 30 is estimated for the pixel block 14 based on the pixel values of the pixel block 14. This estimation is performed according to a well-known motion vector estimation procedure. The estimated motion vector 30 is associated with a reference pixel block 24 in a reference frame 20 of the image or video sequence 1. The motion vector 30 further comprises a first coordinate value, such as x coordinate value, and a second coordinate value, such as y coordinate value. The method then continues to step S1 of FIG. 2, where the first and second coordinate values are co-compressed as previously described in connection with FIG. 2. The result is a compressed representation of the two coordinate values.

The first coordinate value will then be obtained by reading the compressed representation in the first direction starting from the most significant symbol, typically MSB, whereas the second coordinate value is obtained by reading the compressed representation in the opposite direction starting from the least significant symbol, typically LSB.

The embodiments are also highly suitable for usage in connection with compression and decompression of images and textures and in particular compression and decompression of texel blocks. In the art textures are divided into so-called texel blocks, each comprising a number of texels. Such a texel block is typically rectangular or quadratic, such as a size of $M_R \times M_C$ texels, where $M_R$, $M_C$ are positive integer numbers with the proviso that both $M_R$ and $M_C$ are not simultaneously one. Preferably, $M_R = 2^{m_R}$ and $M_C = 2^{m_C}$, where $m_R$, $m_C$ are positive integers. In a typical implementation $M_R = M_C$ and preferred such block embodiments could be 4×4 texels.

In the art, pixel or image element is sometimes employed to denote a texture element of a texture. In the following description, texel is, though, employed to denote a texture element of a texture and pixel is used to denote a picture element generated from such texels, for instance, in connection with rasterization.

A texel is associated with a texel value and a pixel is associated with a pixel value. The texel and pixel values can advantageously be color values. A color value can be represented in various color formats, such as red, green, blue (RGB) color or as luminance and chrominance. Note here that texel values are not necessarily colors. It is also possible that a texel represents a gray value, a normal vector, Z value or in principle any kind of information that can be used during rendering and that is amenable to the type of compression described herein. With the advent of general purpose GPU-programming, it is even possible that the information will not be used for rendering, but for general purpose computation.

In a particular embodiment of texture compression, the texel block consists of or is divided into a first texel sub-block and a second texel sub-block. These two sub-blocks each comprises multiple texel values and collectively form the texel block. FIGS. 7A and 7B illustrate this concept. In the figures, the texel block 40 is illustrated as a 4×4 texel block comprising 16 texels 50. The texel block 40 consists of the first texel sub-block 42 and the second texel sub-block 44 which can be oriented next to each other as in FIG. 2A or on top of each other as in FIG. 2B. In the figures, the two texel sub-blocks 12, 14 are of the same size and comprise 4×2 or 2×4 texels 20 each. This is generally preferred but the embodiments are not limited thereto.

Figure 8:
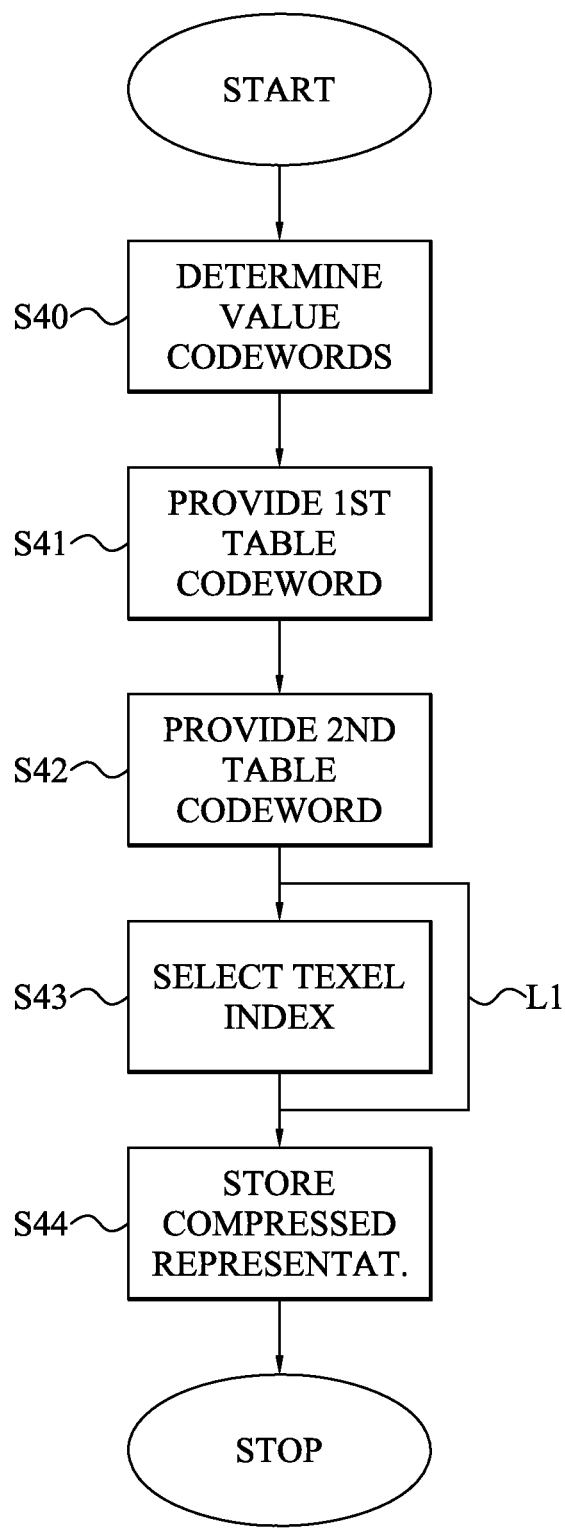
FIG. 8 is a flow diagram illustrating a method of compressing a texel block.

FIG. 8 is a flow diagram illustrating a method of compressing a texel block consisting of two texel sub-blocks. The method starts in step S40 where a first value codeword and a second value codeword are determined. The first value codeword is a representation of a first base texel value for the multiple texels in the first texel sub-block and the second value codeword is a representation of a second base value for the multiple texels in the second texel sub-block. These two value codewords are determined based on the texel values of at least a portion of the multiple texels in the texel block, preferably based on the texel values of all texels in the block. The two value codewords are determined by generating a sequence of bits having a MSB that is the MSB of the first value codeword and a LSB that is the MSB of the second value codeword. Furthermore, the first value codeword comprises at least a portion of, preferably the whole, sequence of bits starting from the MSB of the sequence of bits and extending in a first reading direction towards the LSB. The second value codeword comprises at least a portion of, preferably the whole, sequence of bits starting from the LSB of the sequence of bits and extending in a second, opposite reading direction towards the MSB of the sequence of bits.

Thus, the two value codewords are co-compressed according to the embodiments.

In an embodiment, the value codewords are color codewords and in particular color codewords in the RGB format, i.e. each comprising three color components. In such a case, step S40 preferably involves determining a first sequence of bits that is a compressed representation of the red color components, a second sequence of bits that is a compressed representation of the green color components and a third sequence of bits that is a compressed representation of the blue color components.

The following steps S41 and S42 provide table codewords for the two texel sub-blocks. In more detail, step S41 provides a first table codeword for the first texel sub-block. This first table codeword is a representation of a first modifier set or first modifier table of multiple value modifiers that are employed, during decompression, for modifying the first base texel value represented by the first value codeword. Thus, the value modifiers are defined and employed to generate additional texel values from the first base texel value.

The first table codeword can comprise the relevant modifier values of the first modifier set. For instance assume that the first modifier set is defined as [−α, 0, α], where α is a defined modifier value. In such a case, it is enough to define the value α by the first table codeword since the other value modifiers of the first modifier set can be derived therefrom, i.e. −α, or could be fixed, such as zero. However, it is generally preferred to use a table or codebook of multiple predefined modifier sets to select among. In such a case, the first table codeword is employed in a table look up procedure and is associated with and allows identification of one of the modifier sets from the table. Thus, given the value of the first table codeword provided in step S41 the first modifier set and the value modifiers to use for the first texel sub-block are obtained from the table. This latter embodiment of table codeword is generally preferred over directly representing the value modifiers or a portion thereof in the first table codeword since the total size of the table codeword can typically be kept smaller when employed for table look-up as compared to representing value modifiers.

Step S42 provides a second table codeword that is to be used for the second texel sub-block.

Steps S41 and S42 can be conducted after each other as illustrated in the figure or in the reverse order. Alternatively, they can be performed at least partly in parallel and optionally together.

The provision of table codewords in steps S41 and S42 can be conducted in an exhaustive search, in particular if table codewords are used as table look-ups since then a limited number of combinations need to be tested. For instance, a table codeword of three bits means that eight different modifier sets are available and each and every one of these eight modifier sets can be tested for the respective texel sub-blocks in order to find the one that minimizes the error imposed by the lossy compression.

In the prior art [1], the modifier sets that are available and can be selected for a texel sub-block are limited to comprise four value modifiers each and are generally in the form of [−α, −β, β, α]. However, according to an embodiment the table codeword determined for at least one of the texel sub-blocks does not only define multiple value modifiers but also indicates that the base texel value for a texel of the texel sub-block should be based on the base texel value of the other texel sub-block of the texel block. In other words, a first table codeword provided for the first texel sub-block could define multiple value modifiers and additionally indicate that the base texel value for a texel within the first texel sub-block with a certain texel index should not be equal to the first base texel value represented by the first value codeword but rather be based on the second base texel value that is represented by the second value codeword determined for the second texel sub-block.

Thus, at least one of the texel sub-blocks has a table codeword that allows using the value codeword of the other texel sub-block for its texels even though the texel sub-block should normally use its own value codeword and the other value codeword is determined for the other texel sub-block. As used herein, the sub-block for which such a table codeword is selected is denoted the first texel sub-block. The table codeword provided for the other texel sub-block, i.e. the second texel sub-block, can be according to various embodiments as is further disclosed herein.

If the texel values, for instance, represent colors this dual function of the first table codeword allows the texels of the first texel sub-block to use both a first color codeword representing a first base color and a second color codeword representing a second base color. Thus, the texel sub-block is thereby not limited to use a single chrominance but can actually handle the case with multiple chrominances in the texel sub-block.

A next step S43 selects a texel index for each texel in the texel block as schematically illustrated by the line L1. For the texels in the first texel sub-block step S43 involves selecting a texel index associated with a value modifier of the first modifier set or indicating that the base texel value for the texel is based on the second base texel value. This means that for those texels of the first texel sub-block where a texel index associated with a value modifier is selected, the texel value will be based on and preferably equal to a modified version of the first base texel value represented by the first value codeword. However, for any other texels of the first texel sub-block where the texel index selected in step S43 is not associated with a value modifier of the first modifier set, the texel value is instead based on, such as equal to, the second base texel value represented by the second value codeword.

Step S43 also involves selecting respective texel indices for the texels in the second texel sub-block.

The selection of texel index in step S43 is preferably conducted in an error minimization procedure, where the different available texel indices are tested for the texels and the set of texel indices that minimizes the error when compressing the texel block is selected.

The final step S44 stores a compressed representation of the texel block or compressed texel block comprising the sequence of bits from step S40, the first table codeword provided in step S41, the second table codeword provided in step S42 and the texel indices selected in step S43.

Figure 9:
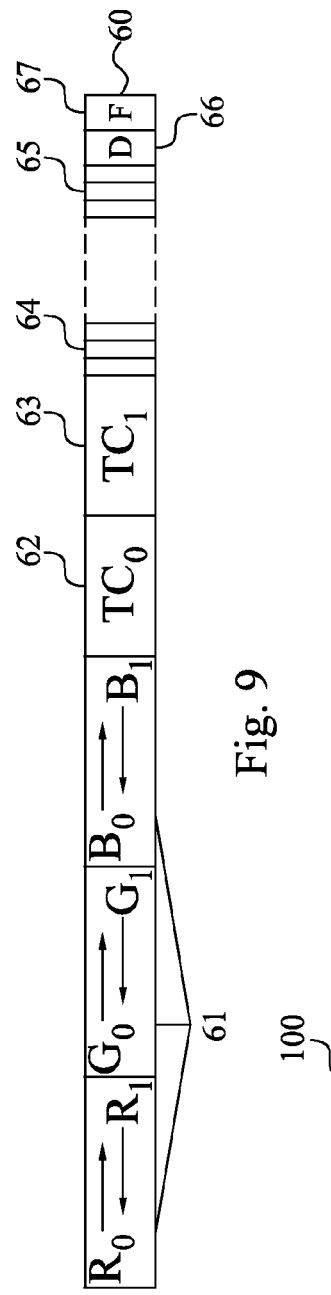
FIG. 9 is a schematic illustration of a compressed representation of a texel block according to an embodiment.

FIG. 9 schematically illustrates such a compressed representation 60 of the texel block. In the figure $R_0/G_0/B_0$ indicates the red/green/blue color component of the first value codeword, $R_1/G_1/B_1$ indicates the red/green/blue color component of the second value codeword and reference number 61 denotes the sequence of bits representing these color components. $TC_0$ is the first table codeword 62 and $TC_1$ denotes the second table codeword 63. Reference numbers 64 and 65 indicate the texel indices of the first and second texel sub-block, respectively. A so-called flip bit 67 is preferably included to define whether a block layout of FIG. 7A or 7B should be used. An optional diff bit 66 can be included to define whether regular coding mode should be used as disclosed herein or differential coding mode as disclosed in [1]. The actual order of the elements of the compressed representation 60 must not necessarily be arranged as illustrated in the figure. In clear contrast, other arrangements are possible and within the scope of the embodiments.

As can be seen from the figure, the first sequence of bits representing the red color components provides the red color component for the first color codeword when read in the first direction, whereas it provides the red color component of the second color codeword when read in the opposite direction. The same applies to the second and third sequences of bits representing the green and blue color components.

The provision of the table codeword for the second texel sub-block in FIG. 8 can be performed according to various embodiments.

In a first embodiment, step S42 involves providing a second table codeword for the second texel sub-block and where the second table codeword is a representation of a second modifier set of multiple modifier values. These modifier values of the second modifier set are to be used during decompression for modifying the second base texel value represented by the second value codeword.

According to this embodiment step S43 involves selecting, for each texel in the second texel sub-block, a texel block associated with one of the value modifiers of the second modifier set or indicating that the base texel value for that texel is based on the first base texel value. Thus, the texels in the second texel sub-block can either be assigned a texel index that indicates that the second base texel value is to be modified by a modifier value to get a reconstructed texel value for that texel. Alternatively, the texel index of the texel indicates that the base texel value and thereby the reconstructed texel value for that texel is instead based on the first base texel value represented by the first value codeword.

Table 2 below is an example of modifier sets that can be used according to an embodiment where the texel values of the texels represent RGB colors and the value modifiers are intensity modifiers.

TABLE 2

Modifier sets

| Table codeword | Modifier set | | | |
|---|---|---|---|---|
| | $11_{bin}$ | $10_{bin}$ | $00_{bin}$ | $01_{bin}$ |
| $000_{bin}$ | −12 | −4 | 4 | 12 |
| $001_{bin}$ | −36 | −8 | 8 | 36 |
| $010_{bin}$ | −72 | −28 | 28 | 72 |
| $011_{bin}$ | −192 | −44 | 44 | 192 |
| $100_{bin}$ | −12 | 0 | X | 12 |
| $101_{bin}$ | −32 | 0 | X | 32 |
| $110_{bin}$ | −64 | 0 | X | 64 |
| $111_{bin}$ | N/A | N/A | N/A | N/A |

In the first embodiment discussed above, the table codewords for the first and second texel sub-blocks are both selected among the table codewords 4-6 ($100_{bin}$-$110_{bin}$). These modifier sets comprise three value modifiers each and an indication (X) specifying that the base texel value of the texel is based on the base texel value determined for the other texel sub-block. Thus, if the texel index selected for a texel is one of $11_{bin}$, $10_{bin}$ or $01_{bin}$ a value modifier associated with this texel index is employed for modifying the base texel value represented by the value codeword determined for the texel sub-block to which the texel belongs. However, if the texel index is instead $00_{bin}$ the base texel value represented by the value codeword determined for the other texel sub-block to which the texel does not belong is instead used for that texel.

Table 3 is a particular example of a table with modifier sets that are suitable for usage in connection with color as texels. Thus, in this example, each texel has a RGB color value and the value modifiers of the modifier sets are intensity modifiers for modifying the intensities of the first or second base color as is further described herein. In Table 3 ($r_0$, $g_0$, $b_0$) denotes the first base color and ($r_1$, $g_1$, $b_1$) represents the second base color. The table illustrates the choices that are possible for the first texel sub-block. A corresponding table for the second texel sub-block is obtained by switching places of ($r_0$, $g_0$, $b_0$) and ($r_1$, $g_1$, $b_1$) in Table 3.

to be applied to the second base texel value. As a consequence, these modifier sets will comprise one additional modifier value as compared to the modifier sets 4-6. It is then not possible to achieve texel values of different chrominance in the texel sub-block.

The co-compressing of the value codewords, such as two color codewords, as described above is in particular suitable for those texel blocks where only one of the base colors is used or where most of the texels is assigned this base color during decompression. The total error for the texel block will then be very sensitive to errors in the first value codeword, whereas the error will be rather insensitive to errors in the second value codeword. The embodiments solve this problem due to the co-compressing of the value codewords allowing a dynamic adjustment of the codeword accuracy on texel block basis.

In another embodiment, the table codeword of a texel sub-block 14 indicates that the value codeword determined for the other texel sub-block 12 is to be used as value codeword for the current texel sub-block 14 and that the table codeword provided for the other texel sub-block 12 and the modifier set represented by this table codeword is to be used as table codeword for the current texel sub-block 14 when generating reconstructed texel values.

This embodiment is indicated by the table codeword 7 ($111_{bin}$) in Table 2 above. Thus, in such a case the value codeword and table codeword of the other texel sub-block in the texel block will be used for the current texel sub-block.

If the table codeword of a texel sub-block is one of table codeword 4-6 in Table 2 and the texel index of a texel is $00_{bin}$ the base texel value of that texel is to be based on the base texel value represented by the value codeword determined for the other texel sub-block. In a particular embodiment, the base texel value of the texel is then equal to the base texel value represented by the value codeword determined for the other texel sub-block.

Another application of the embodiments in connection with texture compression is to conduct co-compressing of two color words for the texture compression scheme S3TC [2]. Briefly, S3TC involves determining two color codewords

TABLE 3

Modifier sets

| Table codeword | Modifier set | | | |
|---|---|---|---|---|
| | $11_{bin}$ | $10_{bin}$ | $00_{bin}$ | $01_{bin}$ |
| $000_{bin}$ | ($r_0$, $g_0$, $b_0$) − 12 * (1, 1, 1) | ($r_0$, $g_0$, $b_0$) − 4 * (1, 1, 1) | ($r_0$, $g_0$, $b_0$) + 4 * (1, 1, 1) | ($r_0$, $g_0$, $b_0$) + 12 * (1, 1, 1) |
| $001_{bin}$ | ($r_0$, $g_0$, $b_0$) − 36 * (1, 1, 1) | ($r_0$, $g_0$, $b_0$) − 8 * (1, 1, 1) | ($r_0$, $g_0$, $b_0$) + 8 * (1, 1, 1) | ($r_0$, $g_0$, $b_0$) + 36 * (1, 1, 1) |
| $010_{bin}$ | ($r_0$, $g_0$, $b_0$) − 72 * (1, 1, 1) | ($r_0$, $g_0$, $b_0$) − 28 * (1, 1, 1) | ($r_0$, $g_0$, $b_0$) + 28 * (1, 1, 1) | ($r_0$, $g_0$, $b_0$) + 72 * (1, 1, 1) |
| $011_{bin}$ | ($r_0$, $g_0$, $b_0$) − 192 * (1, 1, 1) | ($r_0$, $g_0$, $b_0$) − 44 * (1, 1, 1) | ($r_0$, $g_0$, $b_0$) + 44 * (1, 1, 1) | ($r_0$, $g_0$, $b_0$) + 192 * (1, 1, 1) |
| $100_{bin}$ | ($r_0$, $g_0$, $b_0$) − 12 * (1, 1, 1) | ($r_0$, $g_0$, $b_0$) + 0 * (1, 1, 1) | ($r_1$, $g_1$, $b_1$) | ($r_0$, $g_0$, $b_0$) + 12 * (1, 1, 1) |
| $101_{bin}$ | ($r_0$, $g_0$, $b_0$) − 32 * (1, 1, 1) | ($r_0$, $g_0$, $b_0$) + 0 * (1, 1, 1) | ($r_1$, $g_1$, $b_1$) | ($r_0$, $g_0$, $b_0$) + 32 * (1, 1, 1) |
| $110_{bin}$ | ($r_0$, $g_0$, $b_0$) − 64 * (1, 1, 1) | ($r_0$, $g_0$, $b_0$) + 0 * (1, 1, 1) | ($r_1$, $g_1$, $b_1$) | ($r_0$, $g_0$, $b_0$) + 64 * (1, 1, 1) |
| $111_{bin}$ | N/A | N/A | N/A | N/A |

In a second embodiment, step S42 of FIG. 8 instead involves providing a second table codeword that is a representation of a second modifier set of multiple value modifiers for modifying the second base texel value. In clear contrast to the first embodiment discussed above, the second table codeword does not indicate that the first base texel value can be selected for any of the texels in the second texel sub-block.

This embodiment corresponds to one of the modifier sets 0-3 ($000_{bin}$-$011_{bin}$) in Table 2 above. Compared to the previously described embodiment all possible texel indices will in this case be represented by a respective value modifier that is for a texel block of 4×4 texels. The first color codeword represents a first base color and the second color codeword likewise represents a second base color. Up to two additional base colors are then calculated as fixed linear combinations of the first and second base colors. Each texel in the texel block is then assigned a texel index associated with one of the base colors. The compressed representation of the texel block comprises the two color codewords and the sixteen texel indices.

For some texel blocks most of the texels will have texel indices associated with one of the first base color or second base color. In such a case, the total error when compressing these texel blocks will be highly sensitive to the accuracy in one of the color codewords, whereas they are fairly insensitive to the accuracy in the other color codeword.

The co-compressing of the embodiments can therefore advantageously be applied to the S3TC compression scheme by determining the first and second color codewords by generating a sequence of bits having a MSB that is the MSB of the first color codeword and a LSB that is the MSB of the second color codeword. The first color codeword comprises at least a portion of the sequence of bits starting from the MSB of the sequence of bits and extending in a first reading direction towards the LSB. The second color codeword also comprises at least a portion of the sequence of bits, however, instead starting from the LSB of the sequence of bits and extending in an opposite reading direction towards the MSB of the sequence of bits.

Another advantage of the embodiments is that a more even distribution of bits between the different color components can be used. In traditional S3TC, 32 bits are used for the colors, using 16 bits for the first color (RGB565) and 16 bits for the second color. This uneven distribution of bits between the color components is a disadvantage, since the red and blue will contribute more to the error than green since they are assigned five and not six bits. With the embodiments it is possible to use 33 bits for the two colors: 11 bits for the red/green/blue component, where the red/green/blue component for the first color will be read from left to right, and where the red/green/blue component for second color will be read from right to left. In an embodiment, both red/green/blue components could be 6 bits, hence creating an overlap of one bit. In this sense, each color component will get 5.5 bits, and the bit distribution between the different color components will be more even. This should in turn lower the error. To accommodate 33 bits for the color it may be necessary to steal one bit from the indices, or use one bit less for the blue component.

A further application of the embodiments is in connection with normal coding. Most texture compression schemes are concentrating on image-type data, such as photographs. However, with the advent of programmable shaders, textures have started to be used for many other types of data than just traditional photographic images. Bump mapping has therefore become a widespread technique which adds the illusion of detail to geometrical objects in an inexpensive way. More specifically, a texture, called a bump map or normal map, is used at each pixel to perturb the surface normal.

In the majority of cases today, bump mapping is performed in local tangent space (X, Y, Z), of each rendering primitive, e.g. a triangle. Since the length of the normal is not of interest, unit normals can be employed. Thus, the problem is to compress triplets (X,Y,Z), where $X^2+Y^2+Z^2=1$. In a typical embodiment, X and Y are compressed and Z is then computed using $Z=\sqrt{1-X^2-Y^2}$.

In some applications, one of the X and Y coordinates could be more important so that error is more sensitive to one of the coordinates as compared to the other. This is particular true for those pixel or texel blocks where the light incidents on the surface from a defined direction.

The embodiments can therefore be applied to such normal or bump map compression by co-compressing the X coordinate and the Y coordinate by generating a sequence of bits having a MSB that is the MSB of the X coordinate and a LSB that is the MSB of the Y coordinate. The X coordinate is then obtained by reading the sequence of bits in a first reading direction starting from the MSB of the sequence of bits, whereas the Y coordinate is obtained by reading the sequence of bits in the opposite direction starting from the LSB.

Decompression

Figure 10:
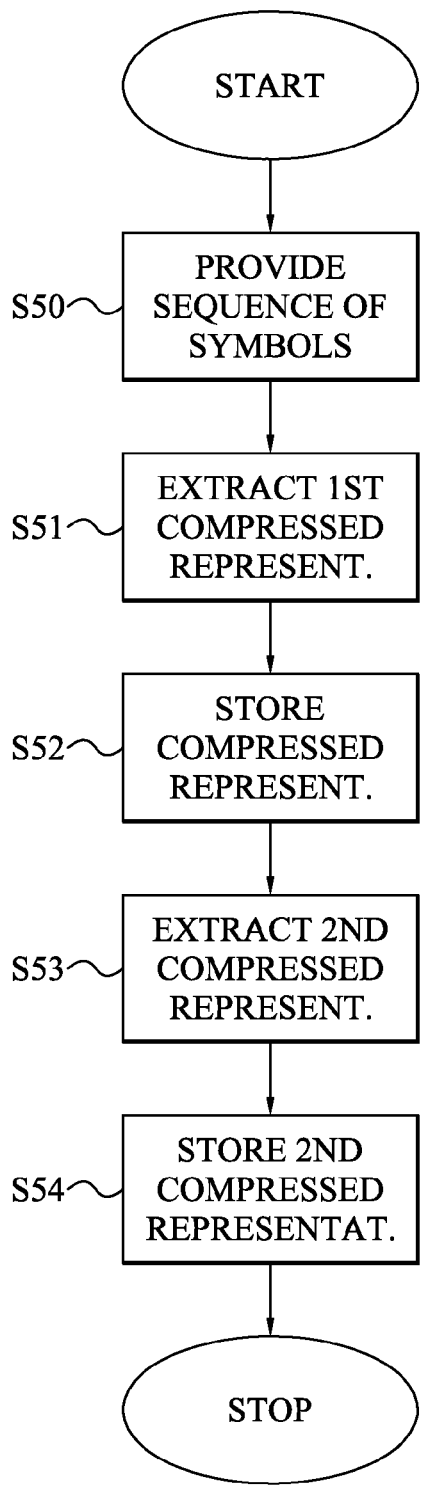
FIG. 10 is a flow diagram illustrating an embodiment of a data decompression method.

FIG. 10 is a flow diagram illustrating a data decompression method according to an embodiment. The method starts in step S50, where a sequence of symbols is provided. This provision of step S50 can be conducted according to various embodiments. For instance, the sequence of symbols can be read and fetched from a memory, where it is stored. Alternatively, the sequence of symbols can have been generated by another entity or device and is transmitted over a wired or wireless transmission line or channel. Thus, in such a case the provision of the sequence of symbols involves receiving the sequence of symbols from some other entity or device.

A next step S51 extracts a compressed representation of a first data value from the sequence of symbols. This compressed representation corresponds to at least a portion of the sequence of symbols, i.e. all symbols of the sequence of symbols or merely a portion thereof. The extraction of the compressed representation involves reading the sequence of symbols in a first reading direction starting from the most significant symbol of the sequence of symbols and towards the least significant symbol of the sequence of symbols.

The compressed representation extracted in step S51 is then stored in a memory in step S52 as a decompressed representation of the first data value. The extract symbols obtained in step S51 can, thus, be used directly as a decompressed representation of the first data value. The decompressed representation can be stored, at least temporarily, in any type of memory including, for instance, RAM, ROM, cache memory or any type of on-chip memory.

The next step S53 extracts a compressed representation of a second data value from the sequence of symbols. In correspondence with the compressed representation extracted in step S51, the compressed representation extracted in step S53 corresponds to at least a portion of the sequence of symbols and is obtained by reading the sequence of symbols in a second, opposite reading direction starting from the least significant symbol of the sequence of symbols and towards the most significant symbol of the sequence of symbol. As a consequence, the least significant symbol of the sequence of symbols becomes the most significant symbol of the extracted compressed representation.

The following step S54 stores, at least temporarily, the compressed representation from step S53 as a decompressed representation of the second data value.

The decompressed representations stored in the memory in steps S52, S54 can then be further processed and in particular be further used in media decoding, such as representing or allowing generation of decoded audio values, decoded pixel or texel colors, decoded motion vector, decoded normal coordinates, and so on.

If the sizes of the extracted compressed representations in terms of the number of symbols are equal and further equal to the size of the sequence of symbols, step S51 involves reading the sequence of symbols in the first direction starting from the most significant symbol up to and including the least significant symbol. Step S53 correspondingly involves reading the sequence of symbols in the second, opposite direction starting from the least significant symbol up to and including the most significant symbol.

The decompression method of FIG. 10 can also be applied to the case of more than two data values. In such a case, an extracting step and a storing step are performed for each data value.

Decompression Implementations

The decompressing method according to the embodiments can be used in vastly different applications, where two or more data values have been co-compressed as previously described. Herein follows a number of implementation examples within the field of media decoding represented by audio decoding, texture decoding and video decoding. The present embodiments are, however, not limited to these particular examples or indeed to the technical field of media decoding.

In audio decoding the sequence of symbols is typically a sequence of bits that is a compressed representation of two stereo audio values. The method discussed above and illustrated in FIG. 10 is then employed to extract the compressed representations of the right and left stereo audio value and then store these compressed representations as decompressed or decoded stereo audio values of a given sample instance. The decompressed stereo audio values can then be forwarded to an audio player and are then played by the audio player and can be perceived by a listener on a pair of connected loudspeakers.

Another application of the embodiments is within the field of video decoding, here represented by inter decoding. As has previously been described, the coordinates of the motion vector can be co-compressed according to the embodiments. In such a case, the decompression method described above and illustrated in FIG. 10 can be used in a decoding process in order to obtain the x and y coordinates of the motion vector, thereby allowing identification of the reference macroblock, based on which a current macroblock should be decoded according to known techniques.

Figure 11:
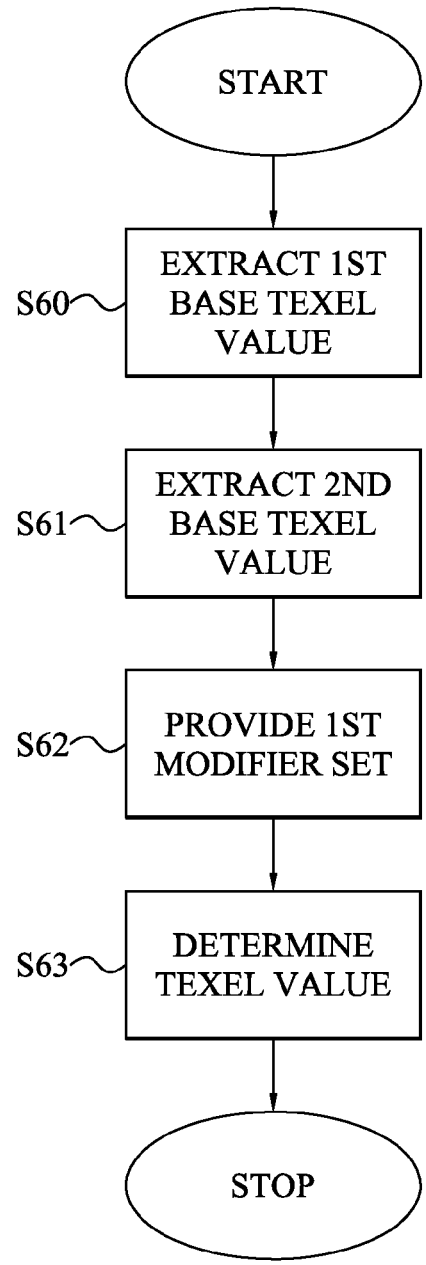
FIG. 11 is a flow diagram illustrating an embodiment of a method of processing a compressed representation of a texel block.

FIG. 11 illustrates a flow diagram of a method of processing a compressed representation of a texel block. This processing of the compressed representation is conducted in order to decompress or decode at least one texel of the texel block consisting of a first texel sub-block and a second texel sub-block. The compressed representation comprises, at least, the previously described sequence of bits representing the first value codeword assigned to the first texel sub-block and the second value codeword assigned to the second texel sub-block, the first table codeword assigned to the first texel sub-block, the second table codeword assigned to the second texel sub-block, and a respective texel index for each texel in the texel sub-block.

A first optional step is to identify the compressed texel block to process. It could be possible that all compressed representations of an encoded texture or image should be decoded in order to generate a decoded representation of the original texture. Typically, only a portion of the original texture is to be accessed at a given processing instance. As a consequence, only a single or a selected number of compressed representations have to be processed in order to obtain at least one decoded or reconstructed texel.

Step S60 of FIG. 11 involves extracting a first base texel value from the sequence of bits. This first base texel value corresponds to at least a portion of the sequence of bits and is obtained by reading the sequence of bits in a first reading direction starting from the MSB and continuing towards the LSB. A next step S61 extracts a second base texel value from the sequence of bits. The second base texel value corresponds to at least a portion of the sequence of bits and is obtained by reading the sequence of bits in a second, opposite reading direction starting from the LSB and continuing towards the MSB. Hence, the LSB of the sequence of bits becomes the MSB of the second base texel value. The first base texel value is assigned for the multiple texels of the first texel sub-block and the second texel value is to be used for the multiple texels of the second texel sub-block. Steps S60 and S61 can be performed sequentially in the order as illustrated in FIG. 11 or in an opposite order, i.e. step S61 prior step S60. Alternatively, the two steps are performed at least partly in parallel.

Step S62 provides a first modifier set of multiple value modifiers based on the first table codeword. These multiple value modifiers are configured to modify the first base texel value determined in step S60.

In an embodiment of step S63 a texel to be reconstructed from the first texel sub-block has a texel index that is not associated with any of the value modifiers of the first modifier set provided in step S62. This texel instead has a texel index with a defined index value, such as $00_{bin}$ when using Table 2 above. This defined index value defines that the texel value of the texel is determined based on the second base texel value instead of a modified version of the first base texel value.

Thus, if the texel index of the texel did not have the defined index value it would instead be associated with one of the value modifiers of the first modifier set. Step S63 would then have involved determining a texel value for the texel based on the selected value modifier and the first base texel value that is assigned to the texel sub-block to which the texel belongs. However, a texel index equal to the defined index value instead signals that the base texel value of the other texel sub-block will be used when determining the texel value for the texel.

The reconstructed texel value obtained for the texel can then be used to generate a pixel value, which is well known in the art. Typically, the reconstructed texel values of multiple texels are needed in order to calculate the pixel value of a single pixel. For instance, in bilinear interpolation a chunk of 2×2 texel values is used for determining a pixel value of a pixel in the decoded image, which is well known in the art. Correspondingly, in trilinear interpolation, eight texel values are used to determine the decoded pixel value of a single pixel.

Figure 12:
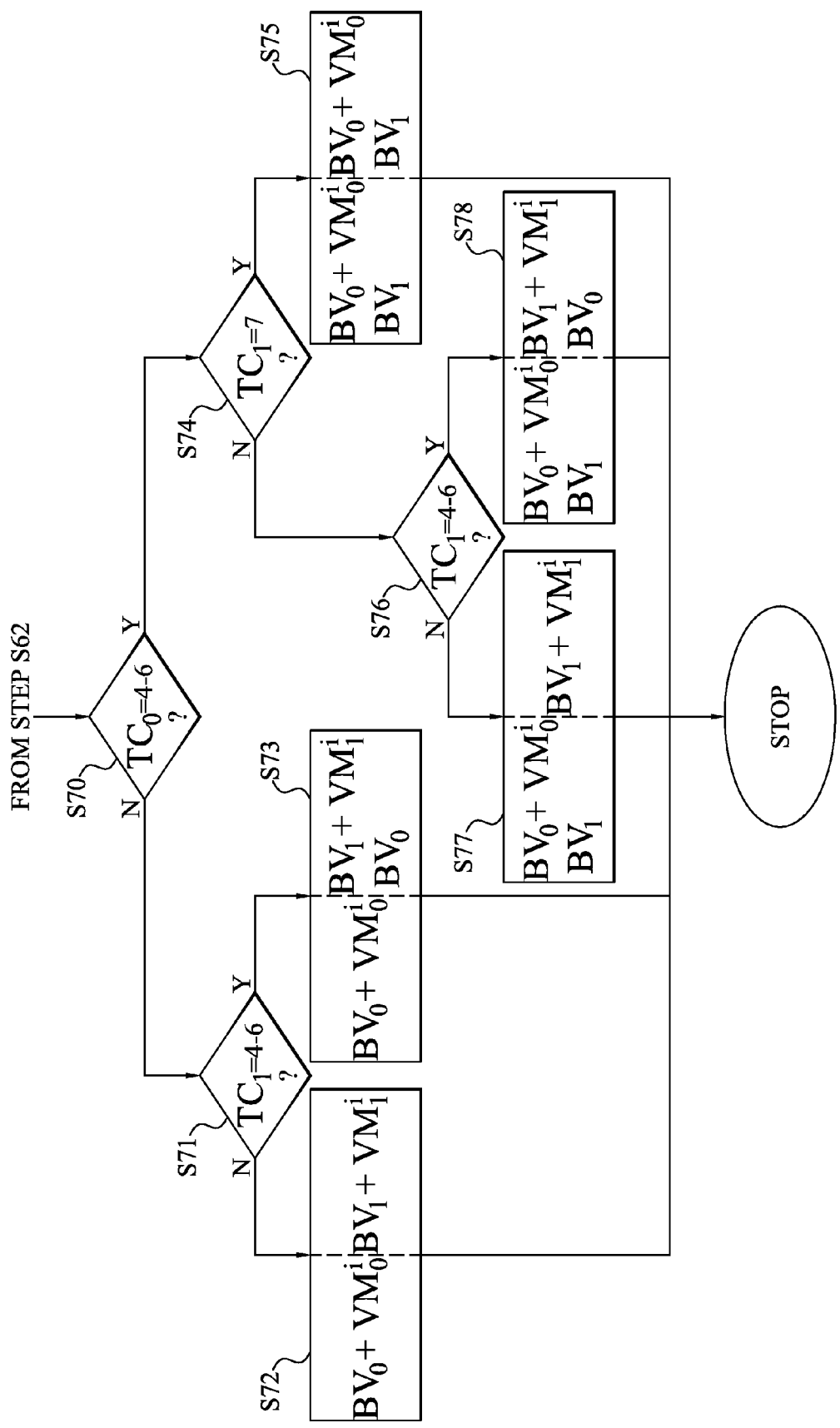
FIG. 12 is a flow diagram illustrating an embodiment of the providing and determining steps of the method illustrated in FIG. 11.

FIG. 12 is a more detailed embodiment of step S63 in FIG. 11 and lists various examples of how a texel value can be determined for a texel based on the values of the table codewords and the texel index of the texel. The embodiment illustrated in FIG. 12 utilizes the modifier sets of Table 2 above or a similar distribution of modifier set, though, optionally with other value modifiers.

The method starts in step S70, which investigates whether the first table codeword, $TC_0$, has any of the values 4-6, i.e. $100_{bin}$-$110_{bin}$. If not the method continues to step 721, which investigates whether the second table codeword, $TC_1$, has any of the values 4-6. If the second table codeword does not have any of the values 4-6 the method continues to step S72. In this case, the first table codeword represents a first modifier set of multiple value modifiers and the second table codeword correspondingly represents a second modifier set of multiple value modifiers, see table codewords 0-3 in Table 2. A texel value of a texel is then determined in step S72 based on the base texel value associated with the texel sub-block to which the texel belongs and the value modifier associated with the texel index of the texels. Thus, the texel value of a texel i from the first texel sub-block is obtained by modifying the first base value, $BV_0$, with the value modifier, $VM_0^i$, associated with the texel index of texel i and selected from the first modifier set. The same procedure is applied to a texel i from the second texel sub-block but then the second base value, $BV_1$, is instead used and the value modifier, $VM_1^i$, is selected from the second modifier set.

In the figure, modification of a base texel value with a value modifier has been exemplified by the addition of the value modifier to the base texel value. In alternative embodiments other types of modifications could instead be used such as multiplication or XOR-operation. If the base value comprises multiple components, the value modifier is preferably added to each of the multiple components or the multiple components are otherwise individually modified with the value modifier.

In step S72 and steps S73, S75, S77 and S78 of FIG. 12, the operation(s) illustrated in the left part correspond(s) to texels in the first texel sub-block of the texel block, whereas the operation(s) in the right part of the hatched line relate(s) to texels in the second texel sub-block.

If, however, the second table codeword has a value of 4-6 the method continues from step S71 to step S73. The calculation of a texel value for a texel in the first texel sub-block is performed in the same way in step S73 as in step S72. However, for texels in the second texel sub-block the texel value is either determined by modifying the second base texel value with a value modifier selected from the second modifier set using the texel index associated with the texel or determined based on the first base texel value assigned to the first texel sub-block. For instance and with reference to Table 2, if the texel index is one of $11_{bin}$, $10_{bin}$ and $01_{bin}$ one of the value modifiers of the second modifier set, such as −12, 0, 12 if the second table codeword=$100_{bin}$, is selected and used to modify the second base texel value. However, if the texel index of a texel instead is $00_{bin}$ the texel value of that texel is determined based on the first base texel value, such as is equal to the first base texel value.

If the first table codeword has a value of 4-6 in step S70 the method continues to step S74. In this case it is determined whether the second table codeword has a value of 7, i.e. $111_{bin}$. In such a case, the method continues to step S75. Having a first table codeword of 4-6 implies that a first modifier set comprising multiple value modifiers is provided based on the first table codeword. If the texel index of a texel in the first texel sub-block has, according to Table 2, one of the values $11_{bin}$, $10_{bin}$ and $01_{bin}$ one of the value modifiers of the first modifier set, such as −32, 0, 32 if the first table codeword=$101_{bin}$, is selected and used to modify the first base texel value. If the texel index of a texel is $00_{bin}$ the texel value of that texel is instead determined based on the second base texel value, such as equal to the second base texel value.

In this case the second table codeword has a defined codeword value, i.e. $111_{bin}$ according to Table 2. This implies that the second table codeword is not associated with any modifier set comprising multiple value modifiers. In clear contrast, the modifier set represented by the first table codeword associated to the first texel sub-block and the first base texel value will be used also for the second texel sub-block. This means that if a texel of the second texel sub-block has any of the values $11_{bin}$, 1 Obin and $01_{bin}$ one of the value modifiers of the first modifier set, such as −32, 0, 32 if the first table codeword=$101_{bin}$, is selected and used to modify the first base texel value in the same way as for texels of the first texel sub-block having the same texel value. If the texel index of the texel in the second sub-block instead has the defined index value, such as $00_{bin}$, the texel value of the texel is determined based on the second base texel value. As is evident from the operations presented in step S75 the same texel values can be obtained in both texel sub-blocks.

If the second table codeword does not have the defined codeword value, such as $111_{bin}$, the method instead continues from step S74 to step S76. Step S76 investigates whether the second table codword has a value representing a modifier set comprising multiple value modifiers or representing a modifier set comprising at least one less value modifier but having the possibility of selecting the base texel value of the other texel sub-block. Thus, if the second table codeword is one of 0-3 according to Table 2, the method continues to step S77. The determination of the texel values for texels in the first texel sub-block is then performed in the same way as in step S75. The texel values for the texels in the second texel sub-block are instead determined as previously described in connection with step S72.

Finally, if both the first and second table codewords have a value of 4-6 according to Table 2, the method continues from step S76 to step S78. The texel values for the texels in the first texel sub-block are determined in step S78 in the same way as in step S75 and S77. Determination of the texel values for the second texel sub-block is conducted in the same way as previously discussed in step S73. It is anticipated by the invention that the order of steps S24 and S26 could be switched in the figure.

Decompression Example

A decompression example is presented below illustrating how the embodiments can be used in connection with texel blocks having RGB colors as texel values. In these examples a compressed representation as illustrated in FIG. 9 is assumed.

In this example the following compressed representation is assumed:

10110001 11001111 01111101 110 111 01 00 . . . 11 00 . . . 0 1

The diff bit is $0_{bin}$ in this case representing normal decompression. The flip bit is set to $1_{bin}$ implying a layout as in FIG. 7B.

The base colors are first determined from the three sequences of bits, each corresponding to a respective color component. The color components of the two base colors are obtained by reading the sequences of bits in respective direction.

$R_0$: $10110001_{bin}$=177
$G_0$: $11001111_{bin}$=207
$B_0$: $01111101_{bin}$=125
$R_1$: $10001101_{bin}$=141
$G_1$: $11110011_{bin}$=243
$B_1$: $10111110_{bin}$=190

The first table codeword is $110_{bin}$ corresponding to modifier set 6 in Table 2 and the second table codeword is $111_{bin}$ representing modifier set 7 in Table 2.

The modifier set to use for the first texel sub-block is [−64, 0, X, 64] according to Table 2. The first texel of the first texel sub-block has texel index $01_{bin}$ corresponding to the intensity modifier 64. The color of the first texel is then obtained by the following intensity modification (177+64, 207+64, 125+64)= (241, 271, 189). In a preferred embodiment, the intensity modified color components are then clamped between a minimum color value and a maximum color value. Thus, if a color component can be represented by n bits the clamping is preferably performed to the interval [0, $2^n-1$]. If the intensity modified color component is smaller than the minimum value, such as 0, it is replaced by this minimum value. Correspondingly, if the intensity modified color component is larger than the maximum value $2^n-1$ it is replaced by the maximum value. This preferred clamping is advantageously also conducted for the other embodiments with base texel value and value modifier and are therefore not necessarily limited to the embodiment with RGB colors and intensity modification.

In the present example, clamping is performed between 0 and 255. Thus, the final color value of the first texel will be (241, 255, 189).

The second texel in the first texel sub-block has texel index $00_{bin}$. This indicates that the color of that texel will be equal to the second base color, i.e. (141, 243, 190).

In this case the second table codeword indicates that the intensity modifiers and base color of the first texel sub-block should also be used for the second texel sub-block.

The first texel of the second texel sub-block has a texel index of $11_{bin}$, which corresponds to an intensity modifier of −64 in the modifier set [−64, 0, X, 64] represented by the first table codeword. The color of this first texel is, thus, (177−64, 207−64, 125−64)=(113, 143, 61).

The at least partly decompressed texel block now looks like:

| (241, 255, 189) | (141, 243, 190) | | |
|---|---|---|---|
| | | | |
| (113, 143, 61) | | | |
| | | | |

Data Compressing Device

Figure 13:
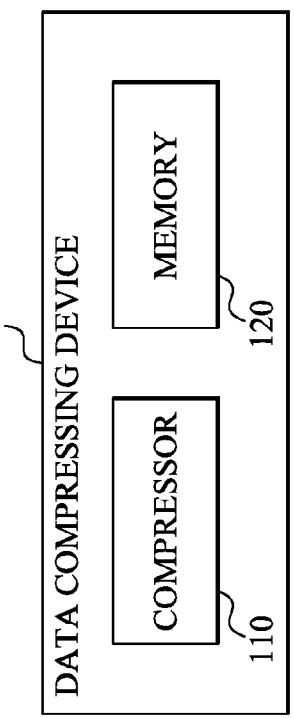
FIG. 13 is a schematic block diagram of a data compressing device according to an embodiment.

FIG. 13 is a schematic block diagram of a data compressing device 100 according to an embodiment. The data compressing device 100 comprises a compressor 110 configured to co-compress a first data value and a second data value. The compressor 110 therefore generates a sequence of symbols having a most significant symbol that also is the most significant symbol of a compressed representation of the first data value and a least significant symbol that is the most significant symbol of a compressed representation of the second data value. The compressed representation of the first data value comprises at least a portion of the symbols of the sequence of symbols starting from the most significant symbol and extending in a first reading direction towards the least significant symbol.

The compressed representation of the second data value correspondingly comprises at least a portion of the symbols of the sequence of symbols starting from the least significant symbol and extending in a second, opposite reading direction towards the most significant symbol.

The data compressing device 100 further comprises a memory 120 in which said sequence of symbols generated by said compressor 110 is at least temporarily stored.

The data compressing device 100 can be configured to co-compress two data values or more than two data values as described herein.

Figure 14:
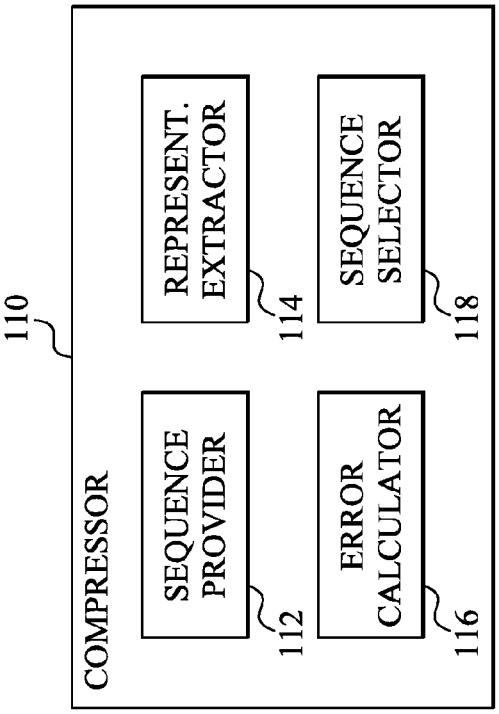
FIG. 14 is a schematic block diagram of the compressor of data compressing device in FIG. 13 according to an embodiment.

FIG. 14 is a schematic block diagram of a particular embodiment of the compressor 100 in FIG. 13. In this embodiment the compressor 110 comprises a sequence provider 112 configured to provide multiple different candidate sequences of symbols, where each such candidate sequence of symbols has the same defined length in terms of the number of symbols. A representation extractor 114 is arranged in the compressor 110 for extract, for each of the candidate sequences of symbols from the sequence provider 112, a candidate compressed representation of the first data value. The candidate compressed representation comprises a fixed number of symbols and is obtained by the representation extractor 114 by reading the candidate sequence of symbols in the first reading direction starting from the most significant symbol and towards the least significant symbol. The representation extractor 114 also extracts, for each of the candidate sequences of symbols, a candidate compressed representation of the second data value. The candidate compressed representation comprises a fixed number of symbols and is obtained by the representation extractor 114 by reading the candidate sequence of symbols in the second reading direction starting from the least significant symbol and towards the most significant symbol.

An error calculator 116 is configured to calculate, for each candidate sequence of symbols, an error value indicative of an error in representing the first data value with the candidate compressed representation of the first data value and representing the second data value with the candidate compressed representation of the second data value. The error value is calculated by the error calculator 116 based on a difference between the first data value and its candidate compressed representation and based on a difference between the second data value and its candidate compressed representation as has been previously described herein.

A sequence selector 118 is configured to select the candidate sequence of symbols provided by the sequence provider 112 resulting in the smallest error as determined based on a comparison of the respective error values calculated for the multiple different candidate sequences of symbols. The identified and selected candidate sequence is then used as compressed representation of the first data value and the second data value.

The sequence provider 112 of the compressor 110 can be operated according to various embodiments for generating and providing the different candidate sequences of symbols, which has previously been described herein in connection with step S20 of FIG. 3.

The compressor 110 can be implemented in hardware, software or a combination of hardware and software. If implemented in software the compressor 110 is implemented as a computer program product stored on a memory and loaded and run on a general purpose or specially adapted computer, processor or microprocessor. The software includes computer program code elements or software code portions effectuating the operation of the sequence provider 112, the representation extractor 114, the error calculator 116 and the sequence selector 118. The program may be stored in whole or part, on or in one or more suitable non-transitory computer readable media or data storage means such as magnetic disks, CD-ROMs, DVD disks, USB memories, hard discs, magneto-optical memory, in RAM or volatile memory, in ROM or flash memory, as firmware, or on a data server.

In an alternative embodiment of the compressor 114, the error calculator 116 is omitted. In such a case, the sequence selector 118 instead conducts the candidate sequence selection based on some other input parameter, such as texel distribution or more generally the frequency of the first data value and the frequency of the second data value.

Implementation Examples of Data Compressing Device

In the following, the data compressing device of FIG. 13 is described in connection with various implementation examples. In these examples only the units and functionality directly involved in generating compressed data are disclosed and described. Thus, the respective compressing systems most often comprise other units and functionality, which are not necessarily directly involved in allowing data compression according to the embodiments. These other units are therefore not discussed herein but are all well known within the respective technical field.

Figure 15:
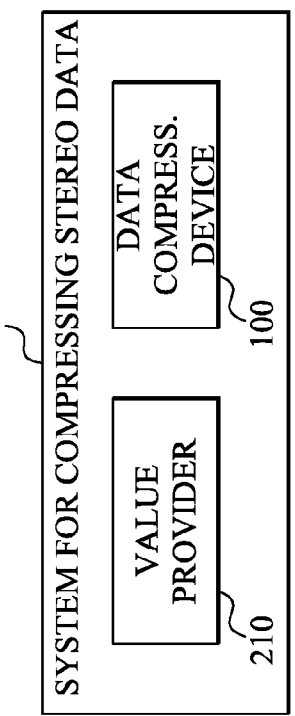
FIG. 15 is a schematic block diagram of a system for compressing stereo audio data according to an embodiment.

FIG. 15 is a schematic block diagram of a system 200 for compressing stereo audio data. The system 200 comprises a value provider 210 configured to provide a first audio data value of a right loudspeaker sample of a given sampling instance and a second audio data value of a left loudspeaker sample of the given sampling instance. The value provider 210 can be configured to fetch these audio data values from an associated memory, receive them from an audio generating or recording device or itself generate them, for instance, by applying PCM to analog audio data. The system 200 also comprises a data compressing device 100 as defined in FIG. 13 configured to co-compress the first audio data value and the second audio data value as previously described.

Figure 16:
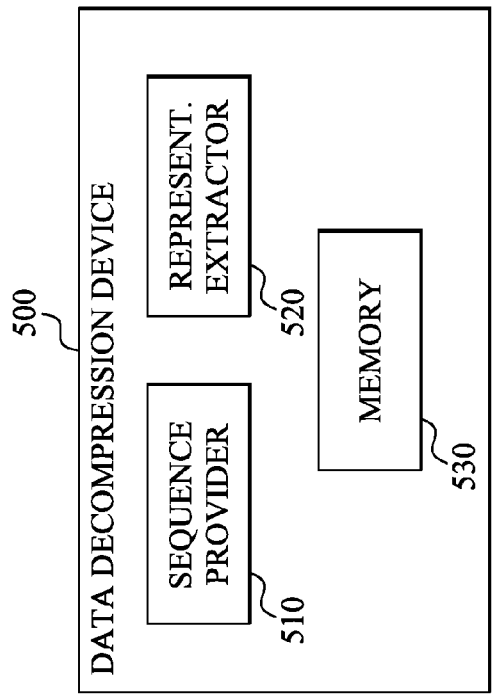
FIG. 16 is a schematic block diagram of a system for compressing motion vector according to an embodiment.

FIG. 16 is a schematic block diagram of a system 300 for compressing a motion vector for a pixel block in a frame of an image or video sequence. The system 300 comprises a motion estimator 310 configured to estimate a motion vector for the current pixel block based on the pixel values of the pixel block and according to a motion vector estimation algorithm. The motion vector is associated with and allows identification of a reference pixel block in a reference frame of the image or video sequence. The present pixel block is then encoded based on the reference pixel block, which is well known in the art. The motion vector comprises a first coordinate value and a second coordinate. The system 300 comprises a data compressing device 100 according to FIG. 13 for co-compressing the first coordinate value and the second coordinate value.

Figure 17:
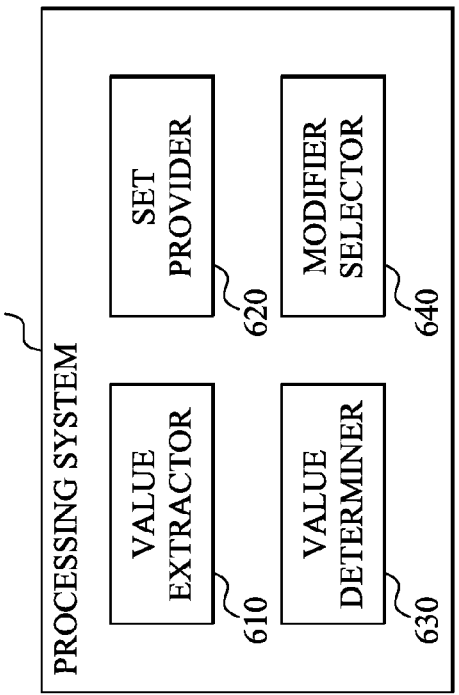
FIG. 17 is a schematic block diagram of a system for compressing texel block according to an embodiment.

FIG. 17 is a schematic block diagram of a system 400 for compressing a texel block. The system 400 comprises a value codeword determiner 410 configured to determine, based on the texel values of the texel block, a first value codeword and a second value codeword. The first value codeword is a representation of a first base texel value for the multiple texels of the first texel sub-block of the texel block and the second value codeword is a representation of a second base texel value for the multiple texels of the second texel sub-block.

The value codeword determiner 410 is configured to generate a sequence of bits having a MSB that corresponds to the MSB of the first value codeword and a LSB that corresponds to the MSB of the second value codeword. The first value codeword corresponds to at least a portion of the bits of the sequence of bits starting from the MSB and continuing in a first reading direction towards the LSB. The second value codeword also corresponds to at least a portion of the bits of the sequence of bits but starts from the LSB and continues in a second, opposite reading direction towards the MSB of the sequence of bits.

A table codeword provider 420 is configured to provide a first table codeword for the first texel sub-block and a second table codeword for the second texel sub-block. The first table codeword is a representation of a first modifier set of multiple value modifiers for modifying the first base texel value.

A table index selector 430 is configured a respective texel index for each texel in the texel block This texel index is, for a texel in the first texel sub-block, associated with a value modifier of the first modifier set or indicates that the base texel value for the texel is based on the second base texel value. In an embodiment, the base texel value for the texel is equal to the second base texel value.

The system 400 also comprises a memory 440 configured to store a compressed representation of the texel block comprising the first and second value codewords, the first and second table codewords and the texel indices. The compressed representation may optionally comprise other elements such as the previously described flip bit and the optional diff bit.

In a particular embodiment, the table codeword provider 420 provides a second table codeword that is a representation of a second modifier set of multiple value modifiers for modifying the second base texel value represented by the second value codeword determined by the value codeword determiner 410.

The table index for a texel of the second texel sub-block can then be selected by the table index selector 430 to either be associated with a value modifier of the second modifier set or indicates that the base texel value for the texel is based on the first base texel value.

In an alternative embodiment the table index for the texel in the second texel block selected by the table index selector 430 can only be associated with a value modifier of the second modifier set.

In another particular embodiment, the table codeword provider 420 is configured to provide a second table codeword that indicates that the first value codeword is to be used as value codeword for the second texel sub-block and that the first table codeword is to be used as table codeword for the second texel sub-block.

The system 400 can be implemented in hardware, software or a combination of hardware and software. If implemented in software the system 400 is implemented as a computer program product stored on a memory and loaded and run on a general purpose or specially adapted computer, processor or microprocessor. The software includes computer program code elements or software code portions effectuating the operation of the value codeword determiner 410, the table codeword provider 420 and the table index selector 430 of the system 400. The program may be stored in whole or part, on or in one or more suitable non-transitory computer readable media or data storage means such as magnetic disks, CD-ROMs, DVD disks, USB memories, hard discs, magneto-optical memory, in RAM or volatile memory, in ROM or flash memory, as firmware, or on a data server.

Data Decompression Device

Figure 18:
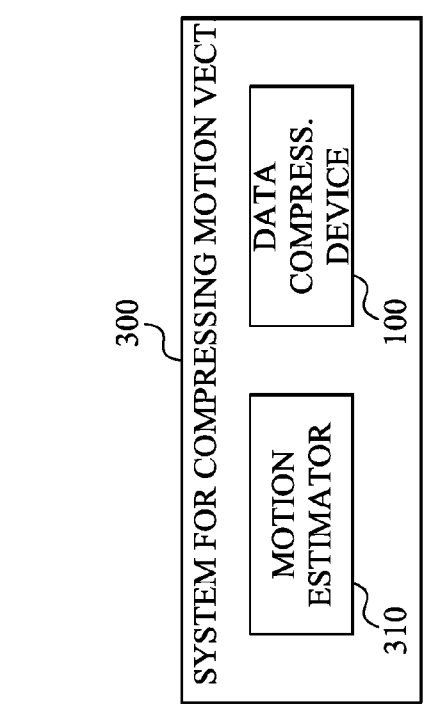
FIG. 18 is a schematic block diagram of a data decompression device according to an embodiment.

FIG. 18 is a schematic block diagram of an embodiment of a data decompression device 500. The data decompression device 500 comprises a sequence provider 510 configured to provide a sequence of symbols. The sequence provider 510 can, for instance, read and fetch the sequence of symbols from an associated memory 530. Alternatively, the data decompression device 500 is arranged in a same device or terminal as the data compressing device as illustrated in FIG. 13. In such a case, the sequence provider 510 can receive the sequence of symbols from the data compressing device over a data bus or fetch from a memory of the data compressing device. A further alternative is when the data compressing device is remotely arranged in another device or terminal than the data decompression device 500. In such a case, the sequence provider 510 can obtain the sequence of symbols from a receiver or input device, which has obtained the sequence of symbols directly or indirectly from the device or terminal housing the data compressing device.

A representation extractor 520 of the data decompression device 500 is configured to extract a compressed representation of a first data value from the sequence of symbols. This compressed representation comprises at least a portion of the sequence of symbols and is obtained by reading the sequence of symbols in the first reading direction starting from the most significant symbol and extending towards and possibly up to and including the least significant symbol, depending on the size of the compressed representation. The representation extractor 520 also extracts a compressed representation of a second data value from the sequence of symbols. The compressed representation comprises at least a portion of the sequence of symbols and is obtained by reading the sequence of symbols in the second, opposite reading direction starting from the least significant symbol and extending towards and possibly up to and including the most significant symbol, depending on the size of the compressed representation.

The data decompression device 500 also comprises a memory 530 configured to store the extracted compressed representations as decompressed representations of the first and second data values.

The data decompression device 500 can be configured to decompress two data values or more than two data values as described herein.

The data decompression device 500 can be implemented in hardware, software or a combination of hardware and software. If implemented in software the data decompression device 500 is implemented as a computer program product stored on a memory and loaded and run on a general purpose or specially adapted computer, processor or microprocessor. The software includes computer program code elements or software code portions effectuating the operation of the sequence provider 510 and the representation extractor 520. The program may be stored in whole or part, on or in one or more suitable non-transitory computer readable media or data storage means such as magnetic disks, CD-ROMs, DVD disks, USB memories, hard discs, magneto-optical memory, in RAM or volatile memory, in ROM or flash memory, as firmware, or on a data server.

Implementation Example of Data Decompression Device

In the following, an example of application of the functionality of the data decompression device of FIG. 18 in connection with a texture processing system is presented as an illustrative but non-limiting example of how the data decompression device can be used in various practical implementations. The other implementation examples presented above in connection with audio, video and texture data can also benefit from using a data decompression device of FIG. 18.

Figure 19:
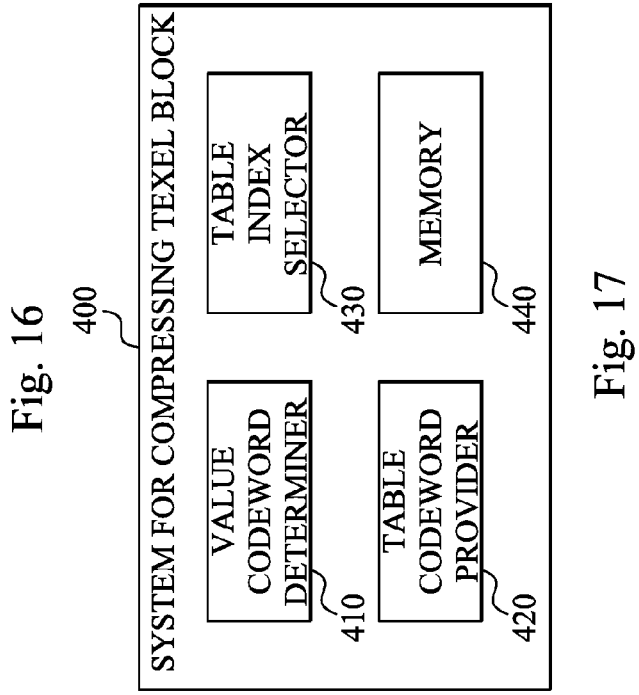
FIG. 19 is a schematic block diagram of a system for processing a compressed representation of a texel block according to an embodiment.

FIG. 19 is a schematic block diagram of an embodiment of a system for processing a compressed representation of a texel block, denoted processing system 600 in the figure. The processing system 600 comprises a value extractor 610 configured to extract a first base texel value and a second base texel from a sequence of bits included in the compressed representation. The first base texel value corresponds to at least a portion of the sequence of bits and is obtained by reading the sequence of bits in a first reading direction starting from the MSB and extending towards the LSB. The second base texel value also corresponds to at least a portion of the sequence of bits but is obtained by reading the sequence of bits in a second, opposite reading direction starting from the LSB and extending towards the MSB.

A set provider 620 of the processing system 600 is configured to provide a first modifier set of multiple value modifiers based on a first table codeword in the compressed representation. These value modifiers are to be used for modifying the first base texel value determined by the value extractor 610 in order to get respective reconstructed texel values.

The processing system 600 also comprises a value determiner 630 configured to determine, for a texel in the first texel sub-block and if a texel index of the texel has a defined index value, a texel value of the texel based on the second base texel value determined by the value extractor 610. In an embodiment, the value determiner 630 simply outputs the second base texel value as texel value for the given texel.

If the texel index of the texel does not have the defined index value a preferred modifier selector 640 of the processing system 600 becomes operational and selects a value modifier from the first modifier set provided by the set provider 620. This modifier selection is further more performed by the modifier selector 640 based on the texel index of the texel. In such a case, the value determiner 630 is configured to determine the texel value for the texel based on modifying the first base texel value with the value modifier selected by the modifier selector from the first modifier set. The modification performed by the value determiner 630 can be addition of the value modifier to the first base texel value, multiplication of the value modifier and the first base texel value or XORing the value modifier and the first base texel value.

In an embodiment the set provider 620 is configured to provide a second modifier set based on the second table codeword of the compressed representation. This second modifier set comprises multiple value modifiers for modifying the second base texel value determined by the value extractor 610.

In this embodiment the value determiner 630 is configured to determine, for a texel in the second texel sub-block and if the texel index of the texel has a defined value, a texel value based on the first base texel value determined by the value extractor 610.

If the texel index of the texel is not of the defined value or if another texel of the texel sub-block does not have texel index equal to the defined value, the modifier selector 640 selects a value modifier from the second modifier set based on the texel index. The value determiner 630 is then configured to determine the texel value of the texel based on modifying the second base texel value with the value modifier selected by the modifier selector 640.

In an alternative embodiment, the second table codeword does not allow the texels of the second texel sub-block to have their texel values determined based on the first base texel value. In such a case, regardless of the actual texel value of texel in the second texel sub-block, the modifier selector 640 will use the texel value in order to identify one of the value modifiers from the second modifier set provided by the set provider 620. The value determiner 630 uses this selected value modifier in order to modify the second base texel value to get the texel value for the texel.

In a particular embodiment and if the second table codeword assigned to the second texel sub-block has a defined codeword value and a texel index of a texel in the second texel sub-block does not have a defined texel value, the modifier selector 640 is configured to select a value modifier from the first modifier set based on the texel index of the texel. The value determiner 630 generates the texel value for the texel based on modifying the first base texel value with the value modifier selected by the modifier selector 640.

If instead the second table codeword has the defined codeword value a texel index of a texel in the second texel sub-block has the defined texel value, the value determiner 630 determines a texel value for the texel based on the second base texel value.

The processing system 600 can be implemented in hardware, software or a combination of hardware and software. If implemented in software the processing system 600 is implemented as a computer program product stored on a memory and loaded and run on a general purpose or specially adapted computer, processor or microprocessor. The software includes computer program code elements or software code portions effectuating the operation of the value extractor 610, the set provider 620, the value determiner 630 and the modifier selector 640 of the processing system 600. The program may be stored in whole or part, on or in one or more suitable non-transitory computer readable media or data storage means such as magnetic disks, CD-ROMs, DVD disks, USB memories, hard discs, magneto-optical memory, in RAM or volatile memory, in ROM or flash memory, as firmware, or on a data server.

However, it is generally preferred to implement the processing system 600 in hardware, such as forming part of a graphical processing unit (GPU) of an image or texture processing unit or device including, for instance, a computer, a game console, a portable device, such as mobile telephone or media processing device.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

REFERENCES

[1] Ström and Akenine-Möller, "iPACKMAN: High-Quality, Low-Complexity Texture Compression for Mobile Phones", In HWWS '05: Proceedings of the ACM SIGGRAPH/EUROGRAPHICS conference on Graphics Hardware (2005), ACM Press, New York, N.Y., USA, 63-70
[2] U.S. Pat. No. 5,956,431

The invention claimed is:
1. A data compressing method comprising:
co-compressing, by a data processing device coupled to a non-transitory memory, at least a first data value and a second data value by generating a sequence of symbols having a most significant symbol that is the most significant symbol of a compressed representation of said first data value and a least significant symbol that is the most significant symbol of a compressed representation of said second data value, wherein said compressed representation of said first data value comprises at least a portion of said sequence of symbols starting from said most significant symbol of said sequence of symbols and extending in a first reading direction towards said least significant symbol and said compressed representation of said second data value comprises at least a portion of said sequence of symbols starting from said least significant symbol and extending in a second, opposite reading direction towards said most significant symbol of said sequence of symbols; and
storing, by the data processing device in the non-transitory memory, said sequence of symbols as a compressed representation of at least said first data value and said second data value.
2. The method according to claim 1, wherein co-compressing comprises co-compressing said first data value and said second data value by generating said sequence of symbols having said most significant symbol that is said most significant symbol of said compressed representation of said first data value and said least significant symbol that is said most significant symbol of said compressed representation of said second data value, wherein said compressed representation of said first data value includes said sequence of symbols starting from said most significant symbol of said sequence of symbols and extending in said first reading direction up to and including said least significant symbol and said compressed representation of said second data value includes said sequence of symbols starting from said least significant symbol and extending in said second, opposite reading direction up to and including said most significant symbol of said sequence of symbols.
3. The method according to claim 1, wherein co-compressing comprises the steps of:

a) providing a candidate sequence of symbols having a most significant symbol and a least significant symbol;
b) extracting a candidate compressed representation of said first data value corresponding to at least a portion of said candidate sequence of symbols by reading said candidate sequence of symbols in a first reading direction starting from said most significant symbol of said candidate sequence of symbols towards said least significant symbol of said candidate sequence of symbols;
c) extracting a candidate compressed representation of said second data value corresponding to at least a portion of said candidate sequence of symbols by reading said candidate sequence of symbols in a second, opposite reading direction starting from said least significant symbol of said candidate sequence of symbols towards said most significant symbol of said candidate sequence of symbols; whereby said least significant symbol of said candidate sequence of symbols becomes a most significant symbol of said candidate compressed representation of said second data value;
d) calculating, based on said candidate compressed representation of said first data value and said candidate compressed representation of said second data value, an error value indicative of an error in representing said first data value with said candidate compressed representation of said first data value and representing said second data value with said candidate compressed representation of said second data value;
e) repeating steps a) to d) for multiple different candidate sequences of symbols;
f) selecting the candidate sequence of symbols of said multiple different candidate sequences of symbols that results in a smallest error as determined based on said error values as said compressed representation of said first data value and said second data value.
4. The method according to claim 3, wherein e) repeating comprises repeating steps a) to d) for all possible candidate sequences of symbols having the same defined length in terms of number of symbols.
5. The method according to claim 1, wherein
co-compressing comprises co-compressing said first data value and said second data value by generating a sequence of bits having a most significant bit that is the most significant bit of said compressed representation of said first data value and a least significant bit that is the most significant bit of said compressed representation of said second data value, wherein said compressed representation of said first data value comprises at least a portion of said sequence of bits starting from said most significant bit of said sequence of symbols and extending in said first reading direction towards said least significant bit and said compressed representation of said second data value comprises at least a portion of said sequence of bits starting from said least significant bit and extending in said second, opposite reading direction towards said most significant bit of said sequence of bits; and
storing comprises storing said sequence of bits as a compressed representation of said first data value and said second data value.
6. The method according to claim 1, wherein co-compressing comprises co-compressing said first data value, said second data value and a third data value by generating said sequence of symbols having said most significant symbol that is said most significant symbol of said compressed representation of said first data value, said least significant symbol that is said most significant symbol of said compressed representation of said second data value and a symbol different from said most significant symbol and said least significant symbol that is a most significant symbol of a compressed representation of said third data value, wherein said compressed representation of said first data value includes said sequence of symbols starting from said most significant symbol of said sequence of symbols and extending in said first reading direction up to and including said least significant symbol, said compressed representation of said second data value includes said sequence of symbols starting from said least significant symbol and comprising every second symbol of said sequence of symbol in said second, opposite reading direction for a portion of said sequence of symbols followed by remaining symbols of said sequence of symbols, and said compressed representation of said third data value includes said sequence of symbols starting from said symbol different from said most significant symbol and said least significant symbol and comprising every second symbol of said sequence of symbols in said second, opposite reading direction for a portion of said sequence of symbols followed by remaining symbols of said sequence of symbols.

7. A method of compressing stereo audio data comprising:
providing a first audio data value for a right loudspeaker sample and a corresponding second audio data value for left loudspeaker sample; and
compressing said first audio data value and said second audio data value according to claim 1.

8. A method of compressing a motion vector for a pixel block comprising multiple pixels in a frame of an image or video sequence comprising:
estimating, based on pixel values of said pixel block and in a motion vector estimation procedure, a motion vector associated with a reference pixel block in a reference frame of said image or video sequence, wherein said motion vector comprises a first coordinate value and a second coordinate value; and
compressing said first coordinate value and said second coordinate value according to claim 1.

9. A method of compressing a texel block including a first texel sub-block comprising multiple texels and a second texel sub-block comprising multiple texels by a data processing device coupled to a non-transitory memory, said method comprising:
determining, by the data processing device, based on texel values of at least a portion of said multiple texels of said texel block, a first value codeword that is a representation of a first base texel value for said multiple texels in said first texel sub-block and a second value codeword that is a representation of a second base texel value for said multiple texels in said second texel sub-block by generating a sequence of bits having a most significant bit that is the most significant bit of said first value codeword and a least significant bit that is the most significant bit of said second value codeword, wherein said first value codeword comprises at least a portion of said sequence of bits starting from said most significant bit of said sequence of bits and extending in a first reading direction towards said least significant bit and said second value codeword comprises at least a portion of said sequence of bits starting from said least significant bit and extending in a second, opposite reading direction towards said most significant bit of said sequence of bits;
providing, by the data processing device, for said first texel sub-block, a first table codeword that is a representation of a first modifier set of multiple value modifiers for modifying said first base texel value;
providing a second table codeword for said second texel sub-block by the data processing device;
selecting, by the data processing device, for each texel in said first texel sub-block, a texel index associated with a value modifier of said first modifier set or indicating that a base texel value for said texel is based on said second base texel value;
selecting, by the data processing device, for each texel in said second texel sub-block, a texel index; and
storing in the non-transitory memory a compressed representation of said texel block comprising said sequence of bits, said first table codeword, said second table codeword and said texel indices.

10. The method according to claim 9, wherein providing said second table codeword comprises providing, for said second texel sub-block, a second table codeword that indicates that said first value codeword is to be used a value codeword for said second texel sub-block and said first table codeword is to be used as table codeword for said second texel sub-block.

11. A data compressing device comprising:
a compressor, implemented by a data processing device, configured to co-compress at least a first data value and a second data value by generating a sequence of symbols having a most significant symbol that is the most significant symbol of a compressed representation of said first data value and a least significant symbol that is the most significant symbol of a compressed representation of said second data value, wherein said compressed representation of said first data value comprises at least a portion of said sequence of symbols starting from said most significant symbol of said sequence of symbols and extending in a first reading direction towards said least significant symbol and said compressed representation of said second data value comprises at least a portion of said sequence of symbols starting from said least significant symbol and extending in a second, opposite reading direction towards said most significant symbol of said sequence of symbols; and
a non-transitory memory coupled to the data processing device and configured to store said sequence of symbols as a compressed representation of at least said first data value and said second data value.

12. The device according to claim 11, wherein said compressor is configured to co-compress said first data value and said second data value by generating said sequence of symbols having said most significant symbol that is said most significant symbol of said compressed representation of said first data value and said least significant symbol that is said most significant symbol of said compressed representation of said second data value, wherein said compressed representation of said first data value includes said sequence of symbols starting from said most significant symbol of said sequence of symbols and extending in said first reading direction up to and including said least significant symbol and said compressed representation of said second data value includes said sequence of symbols starting from said least significant symbol and extending in said second, opposite reading direction up to and including said most significant symbol of said sequence of symbols.

13. The device according to claim 11, wherein said compressor comprises:
a sequence provider configured to provide multiple different candidate sequences of symbols, where each candidate sequence of symbols has a most significant symbol and a least significant symbol;

a representation extractor configured to i) extract, for each candidate sequence of symbols, a candidate compressed representation of said first data value corresponding to at least a portion of said candidate sequence of symbols by reading said candidate sequence of symbols in a first reading direction starting from said most significant symbol of said candidate sequence of symbols towards said least significant symbol of said candidate sequence of symbols and ii) extract, for each candidate sequence of symbols, a candidate compressed representation of said second data value corresponding to at least a portion of said candidate sequence of symbols by reading said candidate sequence of symbols in a second, opposite reading direction starting from said least significant symbol of said candidate sequence of symbols towards said most significant symbol of said candidate sequence of symbols; whereby said least significant symbol of said candidate sequence of symbols becomes a most significant symbol of said candidate compressed representation of said second data value;

an error calculator configured to calculate, for each candidate sequence of symbols and based on said candidate compressed representation of said first data value and said candidate compressed representation of said second data value, an error value indicative of an error in representing said first data value with said candidate compressed representation of said first data value and representing said second data value with said candidate compressed representation of said second data value, a sequence selector configured to select the candidate sequence of symbols of said multiple different candidate sequences of symbols that results in a smallest error as determined based on said error values as said compressed representation of said first data value and said second data value.

14. The device according to claim 11, wherein said compressor is configured to co-compress said first data value, said second data value and a third data value by generating said sequence of symbols having said most significant symbol that is said most significant symbol of said compressed representation of said first data value, said least significant symbol that is said most significant symbol of said compressed representation of said second data value and a symbol different from said most significant symbol and said least significant symbol that is a most significant symbol of a compressed representation of said third data value, wherein said compressed representation of said first data value includes said sequence of symbols starting from said most significant symbol of said sequence of symbols and extending in said first reading direction up to and including said least significant symbol, said compressed representation of said second data value includes said sequence of symbols starting from said least significant symbol and comprising every second symbol of said sequence of symbol in said second, opposite reading direction for a portion of said sequence of symbols followed by remaining symbols of said sequence of symbols, and said compressed representation of said third data value includes said sequence of symbols starting from said symbol different from said most significant symbol and said least significant symbol and comprising every second symbol of said sequence of symbols in said second, opposite reading direction for a portion of said sequence of symbols followed by remaining symbols of said sequence of symbols.

15. A system for compressing stereo audio data comprising:
a value provider configured to provide a first audio data value for a right loudspeaker sample and a corresponding second audio data value for left loudspeaker sample; and
a data compressing device according to claim 11 configured to compress said first audio data value and said second audio data value.

16. A system for compressing a motion vector for a pixel block comprising multiple pixels in a frame of an image or video sequence comprising:
a motion estimator configured to estimate, based on pixel values of said pixel block and in a motion vector estimation procedure, a motion vector associated with a reference pixel block in a reference frame of said image or video sequence, wherein said motion vector comprises a first coordinate value and a second coordinate value; and
a data compressing device according to claim 11 configured to compress said first coordinate value and said second coordinate value.

17. A system for compressing a texel block including a first texel sub-block comprising multiple texels and a second texel sub-block comprising multiple texels, said system comprising:
a value codeword determiner configured to determine, based on texel values of at least a portion of said multiple texels of said texel block, a first value codeword that is a representation of a first base texel value for said multiple texels in said first texel sub-block and a second value codeword that is a representation of a second base texel value for said multiple texels in said second texel sub-block by generating a sequence of bits having a most significant bit that is the most significant bit of said first value codeword and a least significant bit that is the most significant bit of said second value codeword, wherein said first value codeword comprises at least a portion of said sequence of bits starting from said most significant bit of said sequence of bits and extending in a first reading direction towards said least significant bit and said second value codeword comprises at least a portion of said sequence of bits starting from said least significant bit and extending in a second, opposite reading direction towards said most significant bit of said sequence of bits;
a table codeword provider configured to provide, for said first texel sub-block, a first table codeword that is a representation of a first modifier set of multiple value modifiers for modifying said first base texel value and provide a second table codeword for said second texel sub-block;
a texel index selector configured to select, for each texel in said first texel sub-block, a texel index associated with a value modifier of said first modifier set or indicating that a base texel value for said texel is based on said second base texel value and select, for each texel in said second texel sub-block, a texel index; and
a memory configured to store a compressed representation of said texel block comprising said sequence of bits, said first table codeword, said second table codeword and said texel indices.

18. The system according to claim 17, wherein said table codeword provider is configured to provide, for said second texel sub-block, a second table codeword that indicates that said first value codeword is to be used a value codeword for said second texel sub-block and said first table codeword is to be used as table codeword for said second texel sub-block.

19. A data decompression method comprising:
providing a sequence of symbols having a most significant symbol and a least significant symbol;
extracting, by a data processing device, from said sequence of symbols, a compressed representation of a first data value corresponding to at least a portion of said sequence of symbols by reading said sequence of symbols in a first reading direction starting from said most significant symbol towards said least significant symbol;
storing in non-transitory memory said compressed representation of said first data value as a decompressed representation of said first data value;
extracting, by the data processing device, from said sequence of symbols, a compressed representation of a second data value corresponding to at least a portion of said sequence of symbols by reading said sequence of symbols in a second, opposite reading direction starting from said least significant symbol towards said most significant symbol, whereby said least significant symbol becomes a most significant symbol of said compressed representation of said second data value; and
storing in non-transitory memory said compressed representation of said second data value as a decompressed representation of said second data value.

20. The method according to claim 19, wherein
extracting, from said sequence of symbols, said compressed representation of said first data value comprises extracting said compressed representation of said first data value corresponding to all symbols of said sequence of symbols by reading said sequence of symbols in said first reading direction starting from said most significant symbol up to and including said least significant symbol; and
extracting, from said sequence of symbols, said compressed representation of said second data value comprises extracting said compressed representation of said second data value corresponding to all symbols of said sequence of symbols by reading said sequence of symbols in said second, opposite reading direction starting from said least significant symbol up to and including said most significant symbol, whereby said least significant symbol becomes said most significant symbol of said compressed representation of said second data value.

21. The method according to claim 19, wherein
extracting, from said sequence of symbols, said compressed representation of said first data value comprises extracting said compressed representation of said first data value corresponding to all symbols of said sequence of symbols by reading said sequence of symbols in said first reading direction starting from said most significant symbol up to and including said least significant symbol; and
extracting, from said sequence of symbols, said compressed representation of said second data value comprises extracting said compressed representation of said second data value corresponding to all symbols of said sequence of symbols by reading said sequence of symbols in said second, opposite reading direction starting from said least significant symbol and comprising every second symbol of said sequence of symbol in said second, opposite reading direction for a portion of said sequence of symbols followed by remaining symbols of said sequence of symbols, wherein said method further comprises:
extracting, from said sequence of symbols, a compressed representation of a third data value corresponding to all symbols of said sequence of symbols by reading said sequence of symbols in said second, opposite reading direction starting from a symbol of said sequence of symbols different from said most significant symbol and said least significant symbol and comprising every second symbol of said sequence of symbols in said second, opposite reading direction for a portion of said sequence of symbols followed by remaining symbols of said sequence of symbols; and
storing said compressed representation of said third data value as a decompressed representation of said third data value.

22. A method of processing a compressed representation of a texel block including a first texel sub-block comprising multiple texels and a second texel sub-block comprising multiple texels, said compressed representation comprising a sequence of bits having a most significant bit and a least significant bit and representing a first value codeword assigned to said first texel sub-block and a second value codeword assigned to said second texel sub-block, a first table codeword assigned to said first texel sub-block, a second table codeword assigned to said second texel sub-block and a texel index for each texel in said texel block, said method comprising:
extracting, by a data processing device, from said sequence of bits, a first base texel value for said multiple texels of said first texel sub-block corresponding to at least a portion of said sequence of bits by reading said sequence of bits in a first reading direction starting from said most significant bit towards said least significant bit;
extracting, by the data processing device, from said sequence of bits, a second base texel value for said multiple texels of said second texel sub-block corresponding to at least a portion of said sequence of bits by reading said sequence of bits in a second, opposite reading direction starting from said least significant bit towards said most significant bit, whereby said least significant bit becomes a most significant bit of said second base texel value;
providing, by the data processing device, based on said first table codeword, a first modifier set of multiple value modifiers for modifying said first base texel value; and
determining, by the data processing device, for a texel of said first texel sub-block and if a texel index of said texel has a defined index value, a texel value for said texel based on said second base texel value.

23. The method according to claim 22, further comprising:
selecting, for a texel of said second texel sub-block, if said second table codeword has a defined codeword value and a texel index of said texel does not have a defined texel value, a value modifier from said first modifier set based on said texel index of said texel; and
determining a texel value for said texel based on modifying said first base texel value with said value modifier selected from said first modifier set.

24. A data decompression device comprising a processor system including at least one processor coupled to a memory, wherein the processor system is configured to:
provide a sequence of symbols having a most significant symbol and a least significant symbol;
i) extract, from said sequence of symbols, a compressed representation of a first data value corresponding to at least a portion of said sequence of symbols by reading said sequence of symbols in a first reading direction starting from said most significant symbol towards said least significant symbol and ii) extract, from said sequence of symbols, a compressed representation of a second data value corresponding to at least a portion of said sequence of symbols by reading said sequence of symbols in a second, opposite reading direction starting from said least significant symbol towards said most significant symbol, whereby said least significant symbol becomes a most significant symbol of said compressed representation of said second data value; and wherein the processor system is configured to:
i) store said compressed representation of said first data value as a decompressed representation of said first data value and ii) store said compressed representation of said second data value as a decompressed representation of said second data value.

25. The device according to claim 24, wherein said processor system is configured to i) extract, from said sequence of symbols, said compressed representation of said first data value corresponding to all symbols of said sequence of symbols by reading said sequence of symbols in said first reading direction starting from said most significant symbol up to and including said least significant symbol, and ii) extract, from said sequence of symbols, said compressed representation of said second data value corresponding to all symbols of said sequence of symbols by reading said sequence of symbols in said second, opposite reading direction starting from said least significant symbol up to and including said most significant symbol, whereby said least significant symbol becomes said most significant symbol of said compressed representation of said second data value.

26. The device according to claim 24, wherein said processor system is configured to i) extract, from said sequence of symbols, said compressed representation of said first data value corresponding to all symbols of said sequence of symbols by reading said sequence of symbols in said first reading direction starting from said most significant symbol up to and including said least significant symbol, ii) extract, from said sequence of symbols, said compressed representation of said second data value corresponding to all symbols of said sequence of symbols by reading said sequence of symbols starting from said least significant symbol and comprising every second symbol of said sequence of symbol in said second, opposite reading direction for a portion of said sequence of symbols followed by remaining symbols of said sequence of symbols, and iii) extract, from said sequence of symbols, a compressed representation of a third data value corresponding to all symbols of said sequence of symbols by reading said sequence of symbols starting from a symbol of said sequence of symbols different from said most significant symbol and said least significant symbol and comprising every second symbol of said sequence of symbol in said second, opposite reading direction for a portion of said sequence of symbols followed by remaining symbols of said sequence of symbols.

27. A system for processing a compressed representation of a texel block including a first texel sub-block comprising multiple texels and a second texel sub-block comprising multiple texels, said compressed representation comprising a sequence of bits having a most significant bit and a least significant bit and representing a first value codeword assigned to said first texel sub-block and a second value codeword assigned to said second texel sub-block, a first table codeword assigned to said first texel sub-block, a second table codeword assigned to said second texel sub-block and a texel index for each texel in said texel block, said system comprising:

a value extractor implemented by a data processing device and configured to i) extract, from said sequence of bits, a first base texel value for said multiple texels of said first texel sub-block corresponding to at least a portion of said sequence of bits by reading said sequence of bits in a first reading direction starting from said most significant bit towards said least significant bit and ii) extract, from said sequence of bits, a second base texel value for said multiple texels of said second texel sub-block corresponding to at least a portion of said sequence of bits by reading said sequence of bits in a second, opposite reading direction starting from said least significant bit towards said most significant bit, whereby said least significant bit becomes a most significant bit of said second base texel value;

a set provider implemented by the data processing device and configured to provide, based on said first table codeword, a first modifier set of multiple value modifiers for modifying said first base texel value; and a value determiner implemented by the data processing device and configured to determine, for a texel of said first texel sub-block and if a texel index of said texel has a defined index value, a texel value for said texel based on said second base texel value.

28. The system according to claim 27, further comprising a modifier selector implemented by the data processing device and configured to select, for a texel of said second texel sub-block, if said second table codeword has a defined codeword value and a texel index of said texel does not have a defined texel value, a value modifier from said first modifier set based on said texel index of said texel, wherein said value determiner implemented by the data processing device is configured to determine a texel value for said texel based on modifying said first base texel value with said value modifier selected from said first modifier set.

* * * * *

UNITED STATES PATENT AND TRADEMARK OFFICE
CERTIFICATE OF CORRECTION

PATENT NO.        : 9,143,160 B2
APPLICATION NO.   : 13/817000
DATED             : September 22, 2015
INVENTOR(S)       : Ström et al.

Page 1 of 1

It is certified that error appears in the above-identified patent and that said Letters Patent is hereby corrected as shown below:

IN THE SPECIFICATION

In Column 12, Line 38, delete "not" and insert -- no --, therefor.

In Column 25, Line 51, delete "1 Obin" and insert -- $10_{bin}$ --, therefor.

In Column 25, Line 64, delete "codword" and insert -- codeword --, therefor.

In Column 28, Line 44, delete "compressor 114," and insert -- compressor 110, --, therefor.

Signed and Sealed this
Eighth Day of March, 2016

Michelle K. Lee
*Director of the United States Patent and Trademark Office*